United States Patent
Nomura et al.

[11] Patent Number: 5,812,889
[45] Date of Patent: Sep. 22, 1998

[54] LENS GUIDE MECHANISM OF A LENS SHUTTER TYPE OF CAMERA

[75] Inventors: Hiroshi Nomura; Kazuyoshi Azegami; Takamitsu Sasaki, all of Tokyo, Japan

[73] Assignee: Asahi Kogaku Kogyo Kabushiki Kaisha, Tokyo, Japan

[21] Appl. No.: 781,022

[22] Filed: Jan. 9, 1997

[30] Foreign Application Priority Data

Jan. 26, 1996 [JP] Japan ................................ 8-012317
Feb. 19, 1996 [JP] Japan ................................ 8-031081

[51] Int. Cl.$^6$ ............................ G03B 17/00; G03B 9/08
[52] U.S. Cl. ............................ 396/87; 396/451; 396/462
[58] Field of Search ............................ 396/76, 77, 87, 396/449, 451, 462

[56] References Cited

U.S. PATENT DOCUMENTS

| | | | |
|---|---|---|---|
| 4,008,951 | 2/1977 | Himmelsbach | 359/696 |
| 5,122,822 | 6/1992 | Morisawa | 396/63 |
| 5,231,449 | 7/1993 | Nomura | 396/542 |
| 5,237,357 | 8/1993 | Morisawa | 396/449 |
| 5,237,362 | 8/1993 | Ishino et al. | 396/79 |
| 5,287,137 | 2/1994 | Hara et al. | 396/89 |
| 5,339,194 | 8/1994 | Yates | 359/696 |
| 5,363,248 | 11/1994 | Horio | 359/704 |
| 5,634,148 | 5/1997 | Kunishige et al. | 396/86 |
| 5,640,616 | 6/1997 | Ishiguro et al. | 396/86 |

FOREIGN PATENT DOCUMENTS 2027917  2/1980  United Kingdom.

Primary Examiner—Eddie C. Lee
Attorney, Agent, or Firm—Greenblum & Bernstein, P.L.C.

[57] ABSTRACT

A lens guide mechanism has first and second members positioned adjacent to each other in which the second member supports a lens group. The second member is movable relative to the first member along an optical axis of the lens group. The lens guide mechanism also has a first guide shaft extending from the first member to the second member in a direction of the optical axis, one end of the first guide shaft being secured to the second member, a lens shutter provided on the first member, a first encoder provided on the first member for detecting a size of a diaphragm formed by the lens shutter which includes a first photosensor and a first rotating disk associated with the first photosensor, and a second encoder provided on the first member for detecting an axial position of the lens group which includes a second photosensor and a second rotating disk associated with the second photosensor. The first and second rotating disks are positioned adjacent to the guide shaft where the first guide shaft is positioned between the first and second rotating disks.

18 Claims, 21 Drawing Sheets

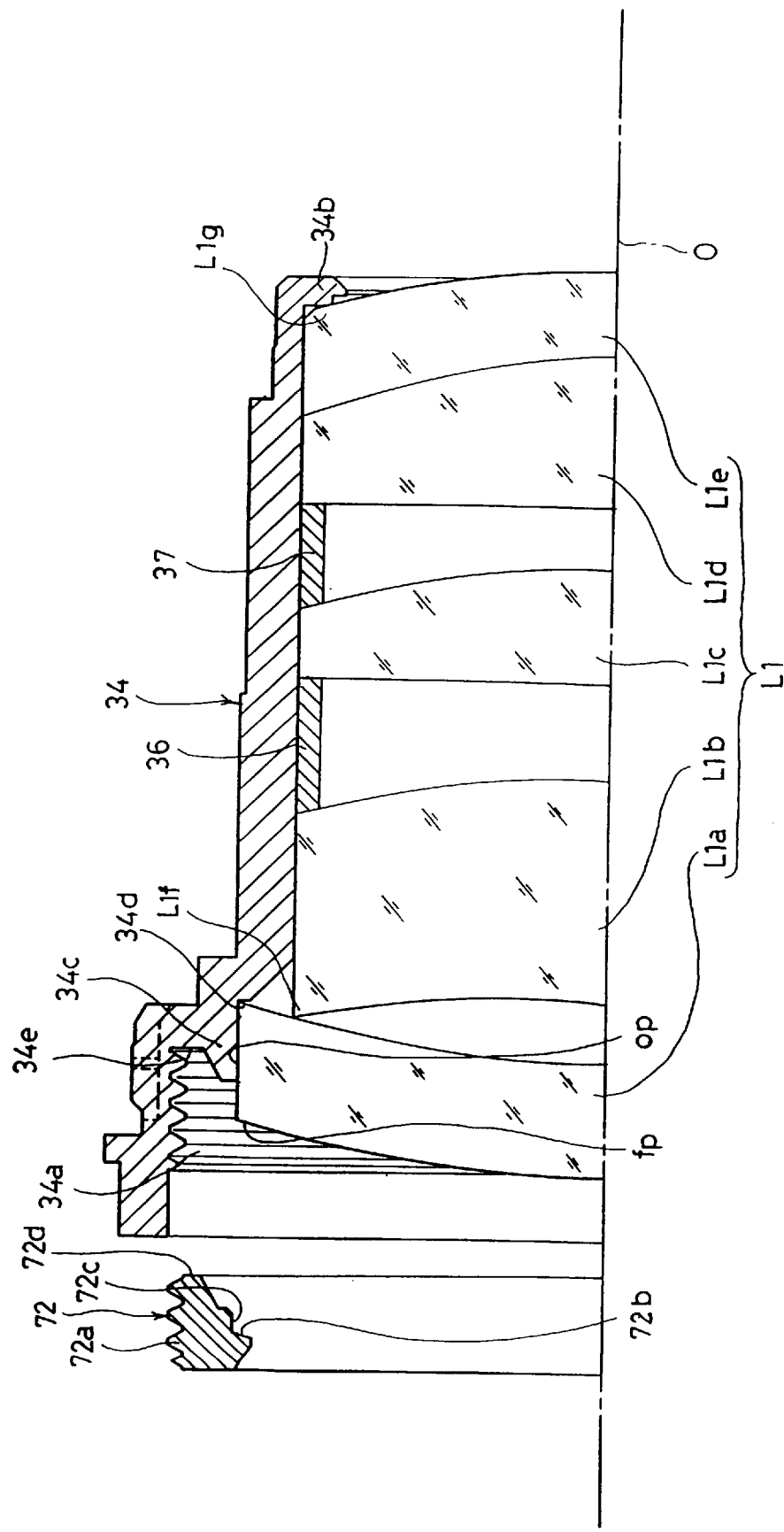

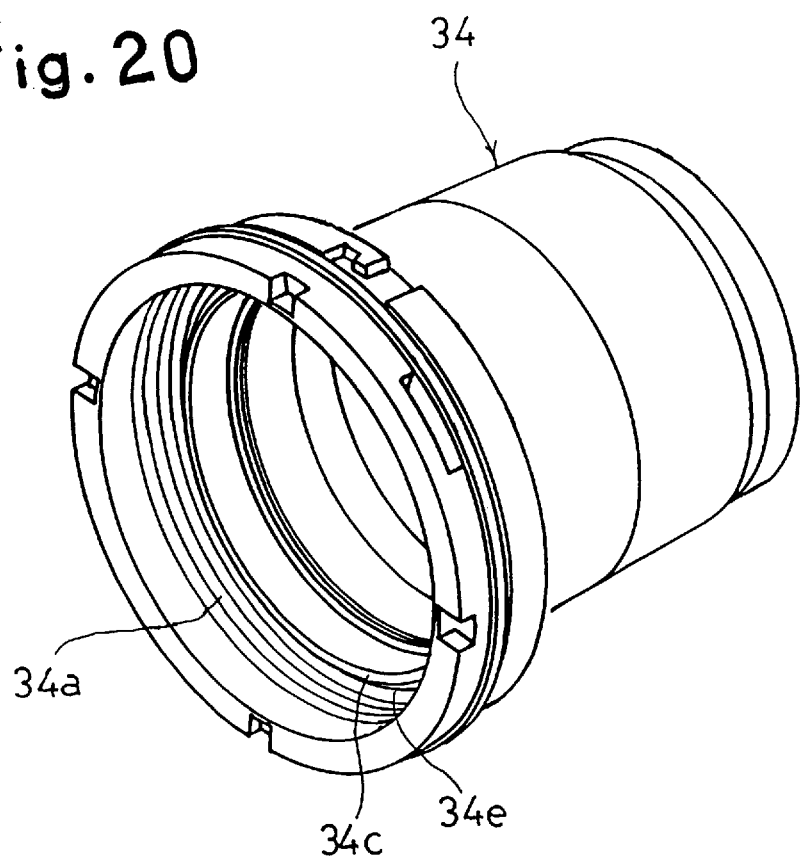

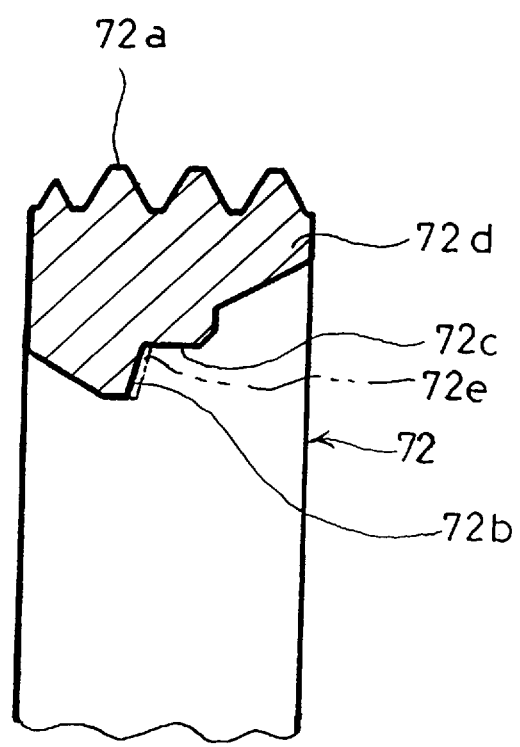

LENS GUIDE MECHANISM OF A LENS SHUTTER TYPE OF CAMERA

BACKGROUND OF THE INVENTION

1. Field of the Invention

The present invention relates to a lens guide mechanism of a zoom lens of a lens shutter type of camera for guiding a movement of a rear lens group of the zoom lens along an optical axis relative to a front lens group of the zoom lens.

2. Description of the Related Art

When it is necessary to guide a first member along a predetermined direction so as to be movable relative to a second member, a device for guiding the first member in such a manner must be provided extending over the first and second members, i.e., a part of the device must be provided directly on the first member and the remaining part of the device must be provided directly on the second member. In the case of providing such a guiding device, if either the first member or the second member, or both of the members have only a small amount of space for a corresponding part of the guiding device to be provided, the first member or the second member, or both of the members must be formed large enough so as to have sufficient space for the corresponding part of the guiding device. However, this increases the size of the first member or the second member, or the size of both of the members.

SUMMARY OF THE INVENTION

An object of the present invention is to provide a space-efficient lens guide mechanism of a lens shutter type of camera for guiding a member (e.g., a lens frame which supports a lens group) along a predetermined direction (e.g., an optical axis of the lens group) so as to be movable relative to another member.

To achieve the object mentioned above, according to an aspect of the present invention, there is provided a lens guide mechanism including first and second members positioned adjacent to each other where the second member supports a lens group and is movable relative to the first member along an optical axis of the lens group, a first guide shaft extending from the first member to the second member in a direction of the optical axis where one end of the first guide shaft is secured to the second member, a lens shutter provided on the first member, a first encoder provided on the first member for detecting a size of a diaphragm formed by the lens shutter which includes a first photosensor and a first rotating disk associated with the first photosensor, and a second encoder provided on the first member for detecting an axial position of the lens group which includes a second photosensor and a second rotating disk associated with the second photosensor. The first and second rotating disks are positioned adjacent to the guide shaft, and the first guide shaft is positioned between the first and second rotating disks.

Preferably, each of the first and second photosensors is a photointerrupter and each of the first and second rotating disks is provided with a plurality of slits.

Preferably, the lens guide mechanism further includes a screw shaft on which a first thread is formed, and which extends in the direction of the optical axis where one end of the screw shaft is secured to the second member.

Preferably, the lens guide mechanism further includes a second guide shaft which extends in the direction of the optical axis and which is supported by the first member to be guided in the direction of the optical axis. One end of the second guide shaft is secured to the second member. Also, the first and second guide shafts are positioned substantially opposite to each other with respect to the optical axis.

Preferably, the lens guide mechanism further includes a screw shaft on which a first thread is formed, and which extends in the direction of the optical axis, where one end of the screw shaft is secured to the second member. In addition, the screw shaft is positioned adjacent to the second guide shaft.

Preferably, the other end of the screw shaft and the second guide shaft are supported by a common supporting plate.

Preferably, the first guide shaft is slidably supported on the first member in the direction of the optical axis so as to prevent the second member for rotating about the screw shaft with respect to the first member.

Preferably, the first member includes a supporting groove formed on the first member which is recessed inwardly in a radial direction of the first member. The first guide shaft is fitted in the supporting groove in a slidable manner in the direction of the optical axis.

Preferably, the first member supports a lens supporting barrel which supports another lens group.

Preferably, the lens guide mechanism further includes a gear rotatably supported on the first member so as not to move in the direction of the optical axis relative to the first member. The gear also includes a hole at an axial center, on an inner periphery of which is formed a second thread, where the gear is rotatably fitted on the screw shaft with the second thread meshing with the first thread.

According to another aspect of the present invention, there is provided a zoom lens including front and rear lens groups, the zoom lens being provided with a rear lens group drive mechanism for driving the rear lens group to move along an optical axis relative to the first lens group, where the zoom lens includes a shutter mounting stage which supports a lens shutter consisting of a plurality of shutter blades, a lens supporting member which supports the rear lens group and is movable along the optical axis relative to the shutter mounting stage without rotating about the optical axis, and a first guide shaft extending from the first member to the second member in a direction of the optical axis where a rear end of the first guide shaft is secured to the second member. The first guide shaft is supported on the first member such that the first guide shaft is movable in the direction of the optical axis relative to the first member and immovable in a circumferential direction of the first member. The zoom lens further includes a second guide shaft extending in the direction of the optical axis which is supported on the shutter mounting stage to be guided in the direction of the optical axis, where a rear end of the second guide shaft is secured to the lens supporting member, a gear rotatably supported on the shutter mounting stage so as not to move in the direction of the optical axis relative to the shutter mounting state, the gear also includes a hole at an axial center, on an inner periphery of which is formed a female thread, and a screw shaft on which a male thread is formed and which extends in the direction of the optical axis where a rear end of the screw shaft being secured to the lens supporting member. The gear is rotatably fitted on the screw shaft with the female thread meshing with the male thread. The zoom lens further includes a first encoder, provided on the shutter mounting stage, for detecting a size of a diaphragm formed by the lens shutter which includes a first photosensor and a first rotating disk associated with the first photosensor, and a second encoder, provided on the shutter mounting stage, for detecting an axial position of the rear lens group which includes a second photosensor and a second rotating disk associated with the second photosensor. The first and second guide shafts are positioned substantially opposite to each other with respect to the optical axis, and the first and second rotating disks are positioned adjacent to the first guide shaft, with the first guide shaft being positioned between the first and second rotating disks.

Preferably, the zoom lens further includes a first moving barrel, a second moving barrel and a third moving barrel concentrically arranged in this order from the optical axis, wherein the first moving barrel supports the shutter mounting stage.

The present disclosure relates to subject matter contained in Japanese Patent Application Nos. 8-12317, filed on Jan. 26, 1996, and 8-31018, filed of Feb. 19, 1996, which are expressly incorporated herein by reference in their entireties.

BRIEF DESCRIPTION OF THE DRAWINGS

The invention will be described below in detail with reference to the accompanying drawings in which similar elements are indicated by similar reference numerals, and wherein:

FIG. 19 is a sectional view of an upper part of a lens supporting barrel which supports a front lens group therein, and a lens fixing ring which is to be screw-engaged with the lens supporting barrel;

FIG. 20 is an enlarged perspective view of the lens supporting barrel shown in FIG. 19; and FIG. 21 is an enlarged sectional view of a part of the lens fixing ring shown in FIG. 19.

DESCRIPTION OF THE PREFERRED EMBODIMENT

Figure 13:
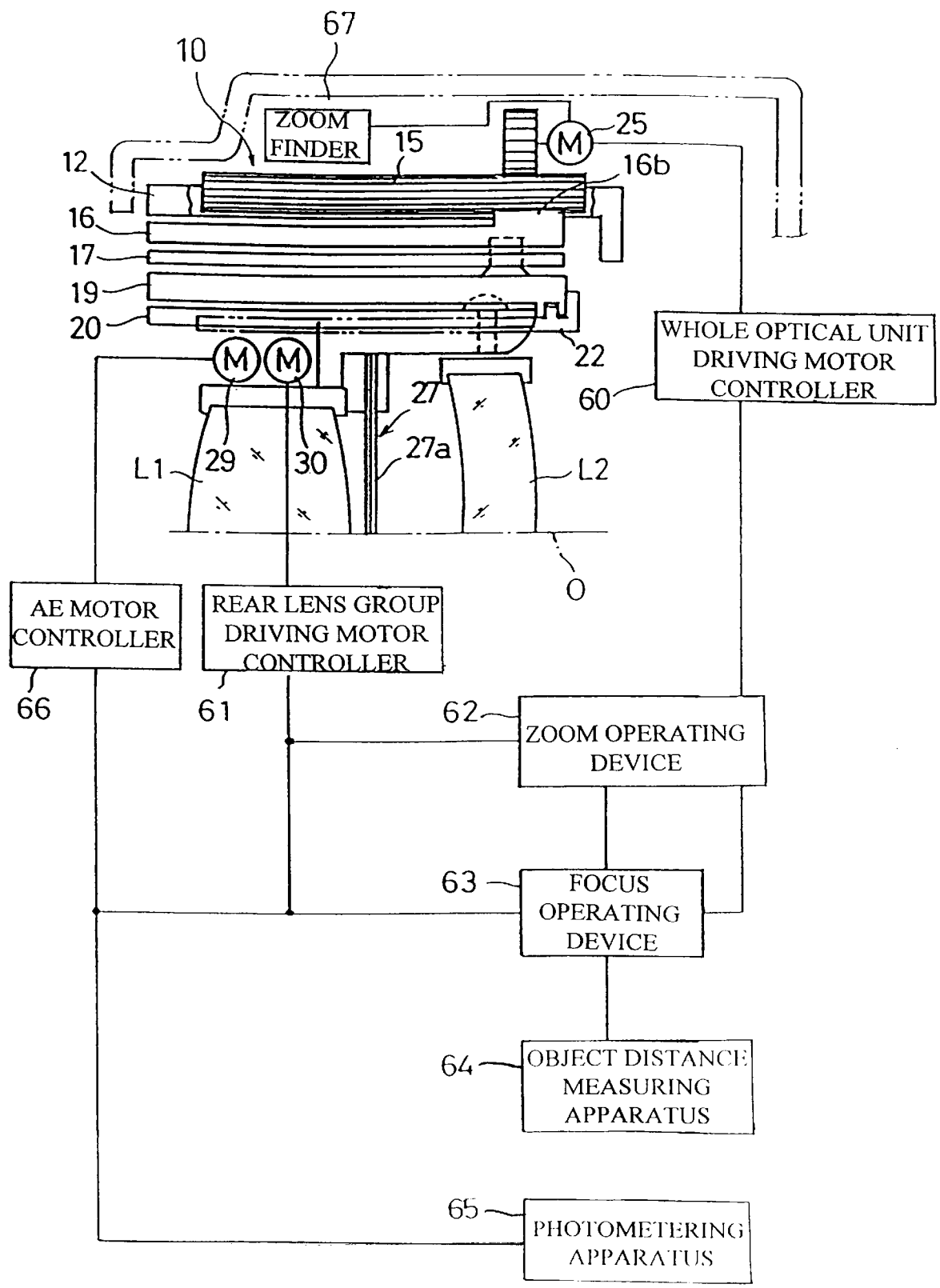
FIG. 13 is a block diagram of a controlling system for controlling an operation of the zoom lens barrel.

FIG. 13 is a schematic representation of various elements which comprise a preferred embodiment of a zoom lens camera to which the present invention is applied. A concept of the present zoom lens camera will now be described with reference to FIG. 13.

The zoom lens camera is provided with a zoom lens barrel (zoom lens) 10 of a three-stage delivery type (telescoping type) having three moving barrels, namely a first moving barrel 20, a second moving barrel 19 and a third moving barrel (rotational barrel) 16, which are concentrically arranged in this order from an optical axis O. In the zoom lens barrel 10, two lens groups are provided as a photographic optical system, namely a front lens group L1 having positive power and a rear lens group L2 having negative power.

In the camera body, a whole optical unit driving motor controller 60, a rear lens group driving motor controller 61, a zoom operating device 62, a focus operating device 63, an object distance measuring apparatus 64, a photometering apparatus 65, and an AE (i.e., automatic exposure) motor controller 66, are provided. Although the specific focusing system of the object distance measuring apparatus 64, which is used to provide information regarding the object-to-camera distance, does not form part of the present invention, one such suitable system is disclosed in commonly assigned U.S. patent application Ser. No. 08/605,759, filed on Feb. 22, 1996, the entire disclosure of which is expressly incorporated by reference herein. Although the focusing systems disclosed in U.S. patent application Ser. No. 08/605,759 are of the so-called "passive" type, other known autofocus systems (e.g., active range finding systems such as those based on infrared light and triangulation) may be used. Similarly, a photometering system as disclosed in the above-noted U.S. patent application Ser. No. 08/605,759 could be implemented as photometering apparatus 65.

The zoom operating device 62 can be provided in the form of, for example, a manually-operable zoom operating lever (not shown) provided on the camera body or a pair of zoom buttons, e.g., a "wide" zoom button and a "tele" zoom button (not shown) provided on the camera body. When the zoom operation device 62 is operated, the whole optical unit driving motor controller 60 drives a whole optical unit driving motor 25 to move the front lens group L1 and the rear lens group L2, rearwardly or forwardly without regard to a focal length and a focal point. In the following explanation, forward and rearward movements of the lens groups L1 and L2 by the whole optical unit driving motor controller 60 (the motor 25) are referred to as the movement toward "tele" and the movement toward "wide" respectively, since forward and rearward movements of the lens groups L1 and L2 occur when the zoom operating device 62 is operated to "tele" and "wide" positions.

The image magnification of the visual field of a zoom finder 67 provided in the camera body varies in accordance with the variation of the focal length through the operation of the zoom operating device 62. Therefore, the photographer can perceive the variation of the focal length by observing the variation of image magnification of the visual field of the finder. In addition, the focal length, as set by the operation of the zoom operating device 62, may be a value indicated by a value on an LCD (liquid crystal display) panel (not shown) or the like.

When the focus operating device 63 is operated, the whole optical unit driving motor controller 60 drives the whole optical unit driving motor 25. At the same time, the rear lens group driving motor controller 61 drives a rear lens group driving motor 30. The driving of the whole optical unit driving motor controller 60 and the rear lens group driving motor controller 61 causes the front and rear lens groups L1 and L2 to be moved to respective positions corresponding to a set focal length and a detected object distance, thereby the zoom lens is focused on the subject.

Specifically, the focus operating device 63 is provided with a release button (not shown) provided on an upper wall of the camera body. A photometering switch and a release switch (both not shown) are synchronized with the release button. When the release button is half-depressed (half step), the focus operating device 63 turns the photometering switch ON, and the object distance measuring and photometering commands are respectively input to the object distance measuring apparatus 64 and the photometering apparatus 65.

When the release button is fully depressed (full step), the focus operating device 63 turns the release switch ON, and according to the result of the object distance measurement and a set focal length, the whole optical unit driving motor 25 and the rear lens group driving motor 30 are driven, and the focusing operation is executed, in which the front lens group L1 and the rear lens group L2 move to the focusing position. Further, an AE motor 29 of an AF/AE (i.e., autofocus/autoexposure) shutter unit (electrical unit) 21 (FIG. 11) is driven via the AE motor controller 66 to actuate a shutter 27. During the shutter action, the AE motor controller 66 drives the AE motor 29 to open shutter blades 27a of the shutter 27 for a specified period of time according to the photometering information output from the photometering apparatus 65.

When the zoom operative device 62 is operated, the zoom operating device 62 drives the whole optical unit driving motor 25 to move the front and rear lens groups L1 and L2 together as a whole in the direction of the optical axis O (optical axis direction). The rear lens group driving motor 30 may also be driven via the rear lens group driving motor controller 61 to move the rear lens group L2 relative to the first lens group L1. However, this may not be performed under the conventional concept of zooming in which the focal length is varied sequentially without moving the position of the focal point.

When the zoom operating device 62 is operated, the following two modes are available:

1. A mode to move the front lens group L1 and the rear lens group L2 in the optical axis direction without varying the distance therebetween by driving only the whole optical unit driving motor 25; and
2. A mode to move the front lens group L1 and the rear lens group L2 in the optical axis direction while varying the distance therebetween by driving both the whole optical unit driving motor 25 and the rear lens group driving motor 30.

In mode 1, during a zooming operation an in-focus condition cannot be obtained at all times with respect to a subject located at a specific distance. However, in a lens-shutter type camera, since the image of the subject is not observed through the photographing optical system, but through the finder optical system provided separately from the photographing optical system, it is sufficient that the subject is only focused when the shutter is released. In mode 2, during a zooming operation the front lens group L1 and the rear lens group L2 are moved without regard to whether the focal point moves, and when the shutter is released, the focusing operation (focus adjusting operation) is carried out by moving both the whole optical unit driving motor 25 and the rear lens group driving motor 30.

When the focus operating device 63 is operated in at least one part of the focal length range set by the zoom operating device 62, the whole optical unit driving motor 25 and the rear lens group driving motor 30 are driven to bring the subject into focus. The amount of movement of each lens group L1 or L2 by the whole optical unit driving motor 25 and the rear lens group driving motor 30 is determined in accordance with subject distance information provided from the object distance measuring apparatus 64, and focal length information set by the zoom operating device 62. By moving both the whole optical unit driving motor 25 and the rear lens group driving motor 30 when the focus operating device 63 is operated, the position of the lens groups L1, L2 can be flexibly controlled in comparison to lens movements controlled by cam.

The zoom lens camera of this embodiment can also be controlled in a manner such that only the magnification of the zoom finder 67 and the focal length information are varied during an operation of the zoom operating device 62, without driving either the whole optical unit driving motor 25 or the rear lens group driving motor 30. Under this type of control, when the focus operating device 63 is operated, both the whole optical unit driving motor 25 and the rear lens group driving motor 30 are moved simultaneously according to the focal length information and the subject distance information obtained by the object distance measuring apparatus 64 to move the front lens group L1 and the rear lens group L2 to respective positions determined according to the focal length and the subject distance information.

An embodiment of the zoom lens barrel according to the above concept will now be described with reference to mainly FIGS. 11 and 12.

The overall structure of the zoom lens barrel 10 will firstly be described.

The zoom lens barrel 10 is provided with the first moving barrel 20, the second moving barrel 19, the third moving barrel 16, and a fixed lens barrel block 12. The third moving barrel 16 is engaged with a cylindrical portion 12p of the fixed lens barrel block 12, and moves in the optical axis direction upon being rotated. The third moving barrel 16 is provided on an inner periphery thereof with a linear guide barrel (cam ring or second barrel) 17, which is restricted in rotation. The linear guide barrel 17 and the third moving barrel 16 move together as a whole in the optical axis direction, with the third moving barrel 16 rotating relative to the linear guide barrel 17. The first moving barrel 20 moves in the optical axis direction with rotation thereof being restricted. The second moving barrel 19 moves in the optical axis direction, while rotating relative to the linear guide barrel 17 and the first moving barrel 20. The whole optical unit driving motor 25 is secured to the fixed lens barrel block 12. A shutter mounting stage 40 is secured to the first moving barrel 20. The AE motor 29 and the rear lens group driving motor 30 are mounted on the shutter mounting stage 40. The front lens group L1 and the rear lens group L2 are respectively supported by a lens supporting barrel (lens supporting annular member) 34 and a lens supporting barrel 50.

Figure 11:
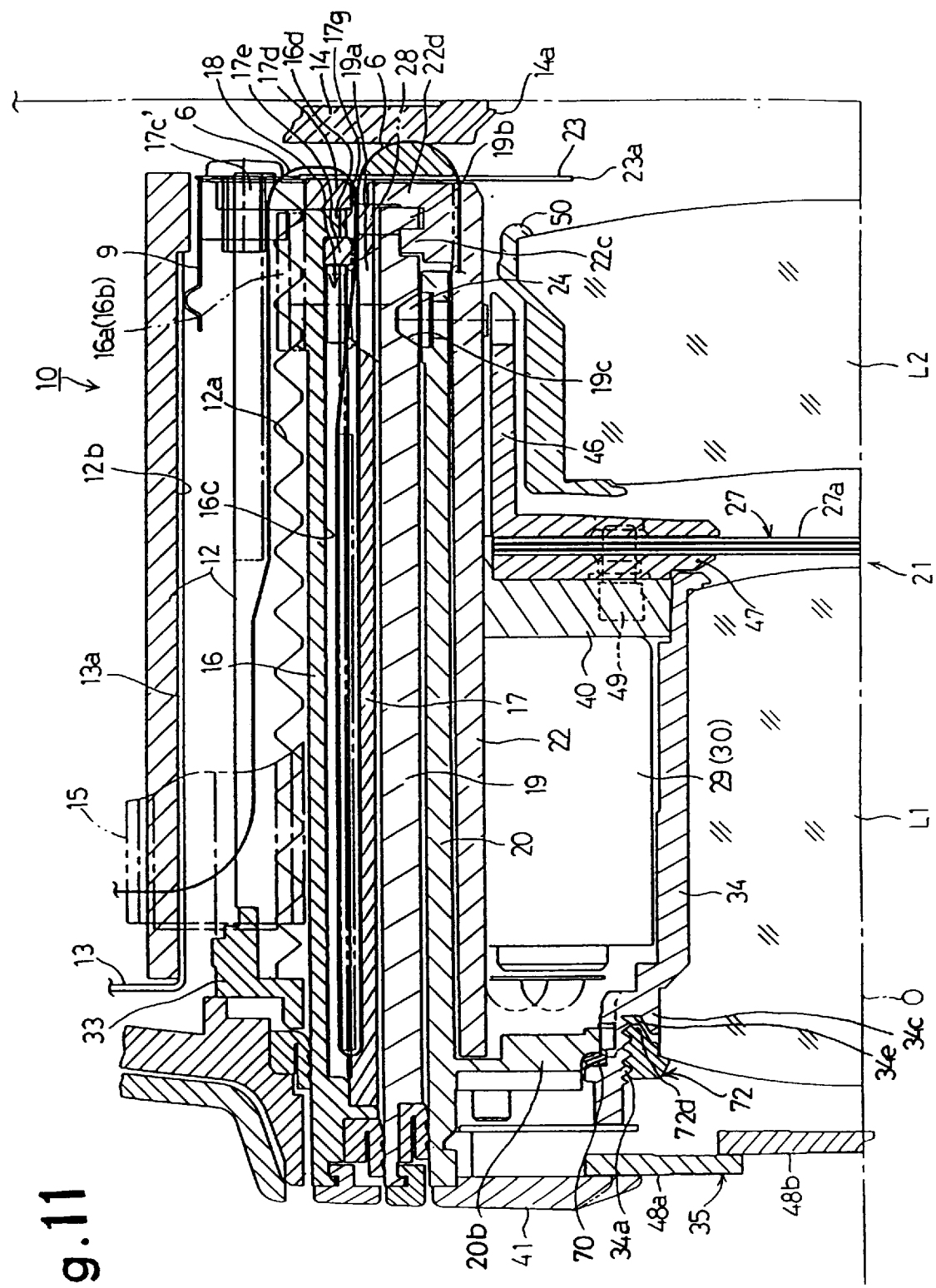
FIG. 11 is a sectional view of an upper part of the zoom lens barrel in the housed state.

An O-ring 70, made of a rubber or the like, is positioned between an outer peripheral circumferential surface of the front end of the lens supporting barrel 34, and an inner peripheral circumferential surface of an inner flange portion 20b integrally formed in the front end of the first moving barrel 20 as shown in FIG. 11. The O-ring 70 prevents water from penetrating the zoom lens barrel 10 at the front end thereof between the first moving barrel 20 and the lens supporting barrel 34.

As shown in FIG. 19, the front lens group L1 consists of five lenses, namely a first lens (frontmost lens) L1a, a second lens L1b, a third lens L1c, a fourth lens L1d and a fifth lens L1e in this order from an object side to an image side, i.e., from the left hand side to the right hand side as viewed in FIG. 19.

A front positioning ring 36 for determining a distance between the second lens L1b and the third lens L1c is positioned and held between the second lens L1b and the third lens L1c. An outer peripheral surface of the positioning ring 36 is fitted on an inner peripheral surface of the lens supporting barrel 34. Likewise, a rear positioning ring 37 for determining a distance between the third lens L1c and the fourth lens L1d is positioned and held between the third lens L1c and the fourth lens L1d. An outer peripheral surface of the positioning ring 37 is fitted on an inner peripheral surface of the lens supporting barrel 34. The rear surface of the fourth lens L1d and the front surface of the fifth lens L1e are cemented to each other, so that the fourth and fifth lenses L1d, L1e are formed as a cemented or composite lens. A front circumferential edge L1f of the second lens L1b along the circumferential edge thereof contacts the rear surface of the first lens L1a. A rear circumferential edge L1g of the fifth lens L1e along the circumferential edge thereof contacts an inwardly-projecting flange 34b formed integral with the rear end of the lens supporting barrel 34.

A female thread 34a is formed on an inner periphery of a front part of the lens supporting barrel 34, as shown in FIGS. 19 or 20. A lens fixing ring 72, for fixing the first lens L1a to the lens support barrel 34, engages with the lens supporting barrel 34. With this arrangement, a male thread 72a formed on the outer peripheral surface of the lens fixing ring 72 meshes with the female thread 34a. A circular abutting surface 72b is formed on an inner peripheral surface of the lens fixing ring 72. The circular abutting surface 72b comes into contact with a circumferential portion fp of the front surface of the first lens L1a in a state when the lens fixing ring 72 is properly screw-engaged with the lens supporting barrel 34. The circular abutting surface 72b is formed to be substantially parallel to the circumferential portion fp so that the circular abutting surface 72b and the circumferential portion fp may be brought tightly into contact with each other when the lens fixing ring 72 is properly screw-engaged with the lens supporting barrel 34.

A supporting ring portion 34c is integrally formed with the lens supporting barrel 34. The supporting ring portion 34c is located inwardly from the female thread 34a in a radial direction of the lens supporting barrel 34. The inner peripheral surface of the supporting ring portion 34c, which extends in the optical axis direction, comes into contact with an outer circumferential edge or surface op of the first lens L1a. An annular positioning surface 34d, extending substantially normal to the optical axis O, is formed on the lens supporting barrel 34 immediately behind the supporting ring portion 34c. The circumferential edge of the rear surface of the first lens L1a comes into contact with the positioning surface 34d. With this structure, the first lens L1a is immovably held between the circular abutting surface 72b and the positioning surface 34d in the optical axis direction, and the first lens L1a is immovably held by the supporting ring portion 34c in a radial direction normal to the optical axis O.

As shown in FIG. 21, a coating 72e is coated on the circular abutting surface 72b. The coating 72e is a waterproof coating made of a synthetic resin. In the present embodiment, Fantas Coat SF-6 (trademark of a coating produced by the Japanese Company "Origin Denki Kabushiki Kaisha") is used as the coating 72e. The front surface of the first lens L1a is formed very smooth, whereas the circular abutting surface 72b of the lens fixing ring 72 is not formed as smoothly (i.e., has a rough finish) as the front surface of the first lens L1a. This is because the first lens L1a is more minutely and accurately formed than the lens fixing ring 72 since the first lens L1a is a precision optical element. Because of the differences in the finishes, in the absence of the coating 72e on the circular abutting surface 72b, a substantial gap would be formed between the circular abutting surface 72b and the circumferential portion fp. This would be the case even if the circular abutting surface 72b was properly and tightly in contact with the circumferential portion fp by properly screw-engaging the lens fixing ring 72 with the female thread 34a. As a result, water or moisture would be able to penetrate into the lens supporting barrel 34 through the substantial gap. However, in the present embodiment, the coating 72e is applied to the circular abutting surface 72b so as to make the surface thereof a smooth surface which eliminates the substantial gap between the circular abutting surface 72b and the circumferential portion fp when the circular abutting surface 72b properly contacts the circumferential portion fp. Accordingly, the coating 72e, positioned and held between the circular abutting surface 72b and the circumferential portion fp, effectively prevents water or moisture from penetrating the lens supporting barrel 34 between the circular abutting surface 72b and the circumferential portion fp when the circular abutting surface 72b is properly and tightly in contact with the circumferential portion fp by properly screw-engaging the lens fixing ring 72 with the female thread 34a.

A circular surface 72c is formed on the lens fixing ring 72. The circular surface 72c is connected to the circular abutting surface 72b and is located immediately outward in a radial direction from the circular abutting surface 72b. A front part of the outer circumferential surface op of the first lens L1a (i.e., a circumferential edge of the first lens L1a) comes into contact with the circular surface 72c when the lens fixing ring 72 properly engages with the female thread 34a. Due to the circular surface 72c contacting the outer circumferential surface op, the watertight structure between the circular abutting surface 72b and the circumferential portion fp, that is realized by the coating 72e, is enhanced. That is, a highly efficient watertight connection between the first lens L1a and the lens fixing ring 72 is realized by providing both the coating 72e and the circular surface 72c with the lens fixing ring 72.

An annular recessed portion 34e is formed on the lens supporting barrel 34 between the female thread 34a and the supporting ring portion 34c. As shown in FIG. 11, in a state where the lens fixing ring 72 is properly screw-engaged with the female thread 34a, a rear end 72d of the lens fixing ring 72 is positioned in the annular recessed portion 34e with the rear end 72d not contacting the bottom (i.e., rearmost end) of the recessed portion 34e. In particular, an annular space is formed in the annular recessed portion 34e between the rear end 72d and the bottom of the recessed portion 34e.

The fixed lens barrel block 12 is fixed in front of an aperture plate 14 fixed to the camera body. The aperture plate 14 is provided on a center thereof with a rectangular-shaped aperture 14a which forms the limits of each frame exposed. The fixed lens barrel block 12 is provided on an inner periphery of the cylindrical portion 12p, with a female helicoid 12a, and also a plurality of linear guide grooves 12b each extending parallel to the optical axis O, i.e., extending in the optical axis direction. At the bottom of one of the linear guide grooves 12b, namely 12b', a code plate 13a, having a predetermined code pattern, is fixed. The code plate 13a extends in the optical axis direction and extends along substantially the whole of the length of the fixed lens barrel block 12. The code plate 13a is part of a flexible printed circuit board 13 positioned outside the fixed lens barrel block 12.

Figure 7:
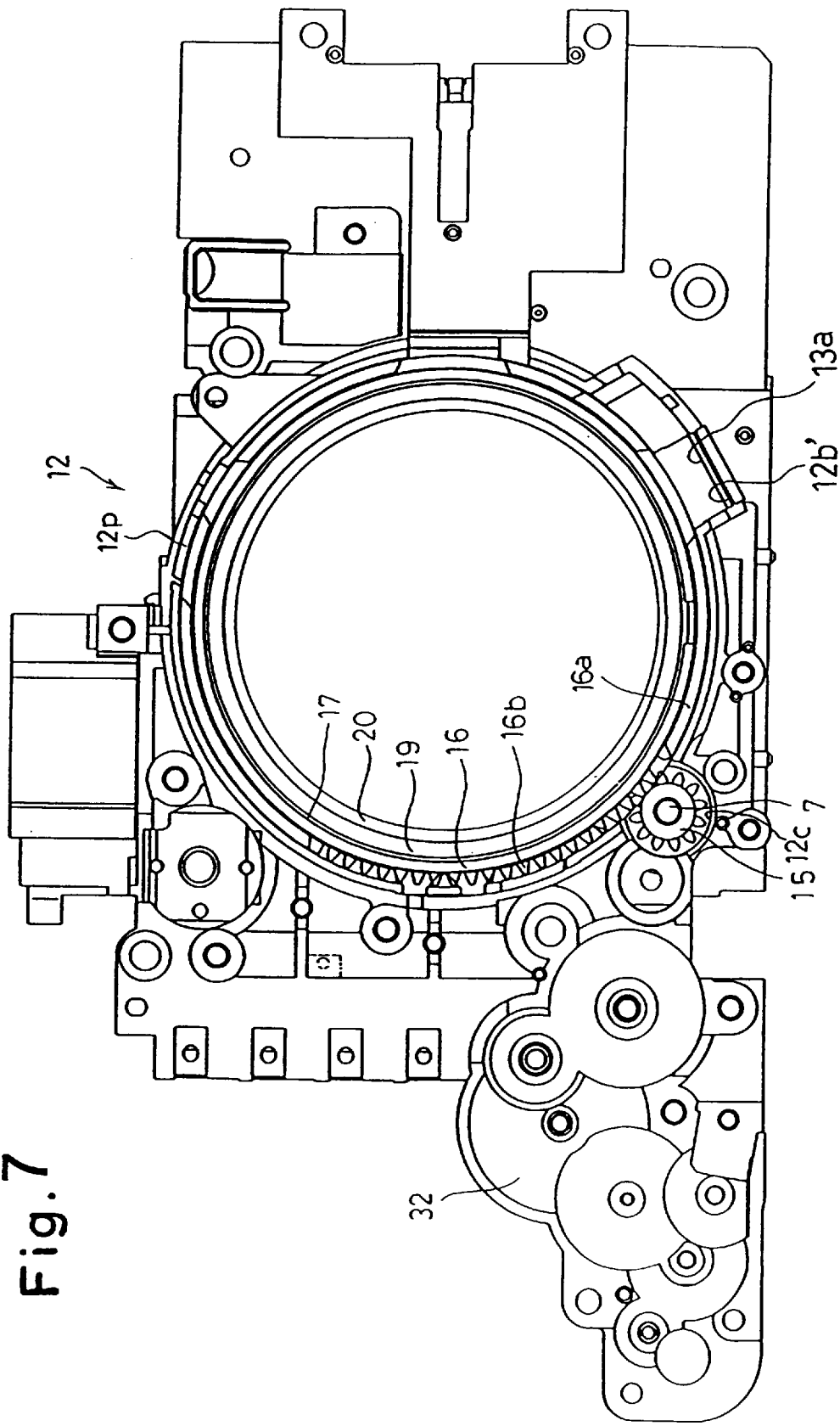
FIG. 7 is a front elevational view of a fixed lens barrel block of the zoom lens barrel.
Figure 12:
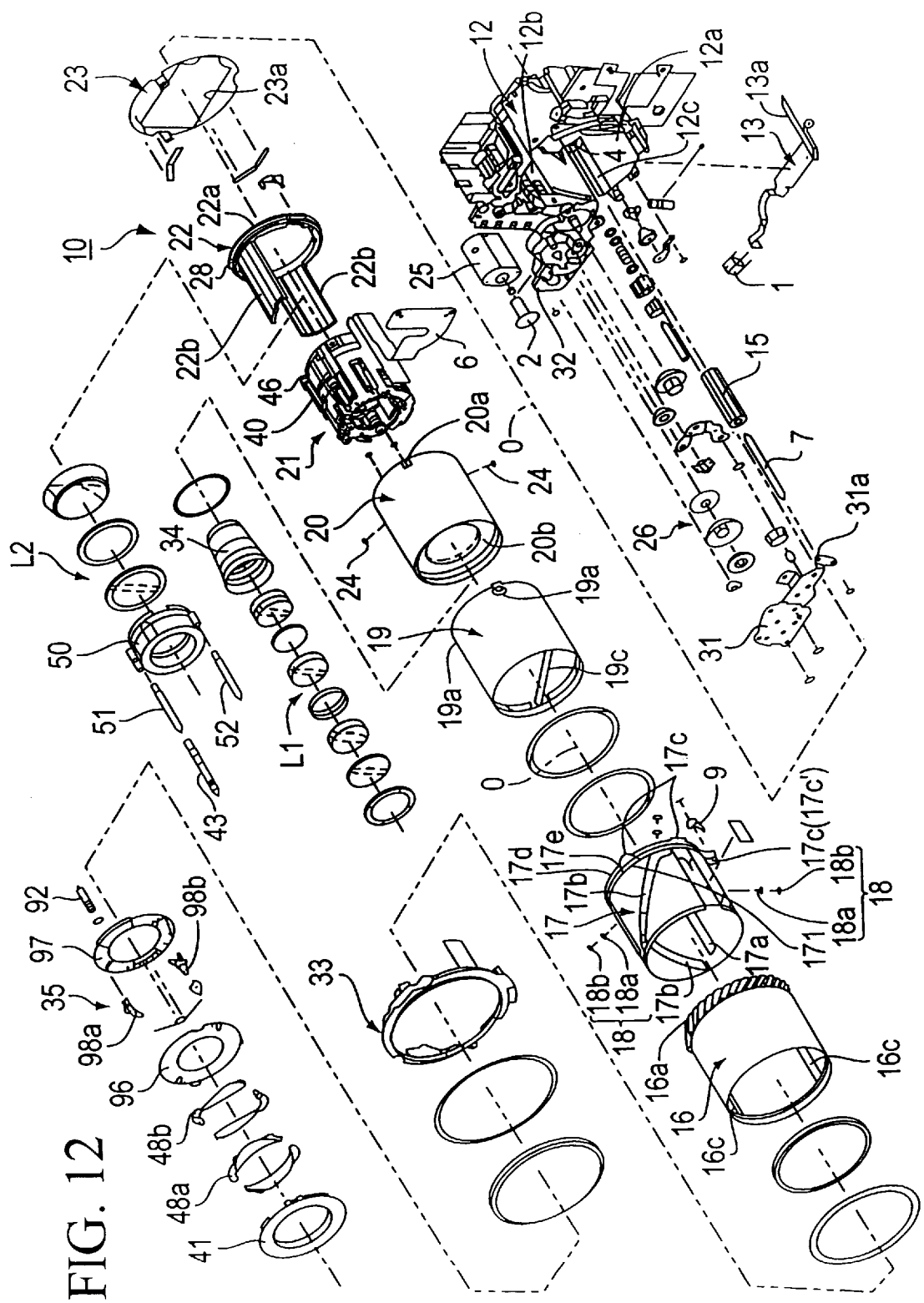
FIG. 12 is an exploded perspective view of the overall structure of the zoom lens barrel.

As shown in FIGS. 7 and 12, in the fixed lens barrel block 12, a gear housing 12c is provided which is recessed outwardly from an inner periphery of the cylindrical portion 12p of the fixed lens barrel block 12 in a radial direction while extending in the optical axis direction. In the gear housing 12c, a driving pinion 15 is rotatably held and extends in the optical axis direction. Both ends of an axial shaft 7 of the driving pinion 15 are rotatively supported by a supporting hollow 4, provided in the fixed lens barrel block 12, and a supporting hollow 31a, provided on a gear supporting plate 31 fixed on the fixed lens barrel block 12 by set screws (not shown), respectively. Part of the teeth of the driving pinion 15 project inwardly from the inner periphery of the cylindrical portion 12p of the fixed lens barrel block 12 so that the driving pinion 15 meshes with an outer peripheral gear 16b of the third moving barrel 16, as shown in FIG. 7.

Figure 6:
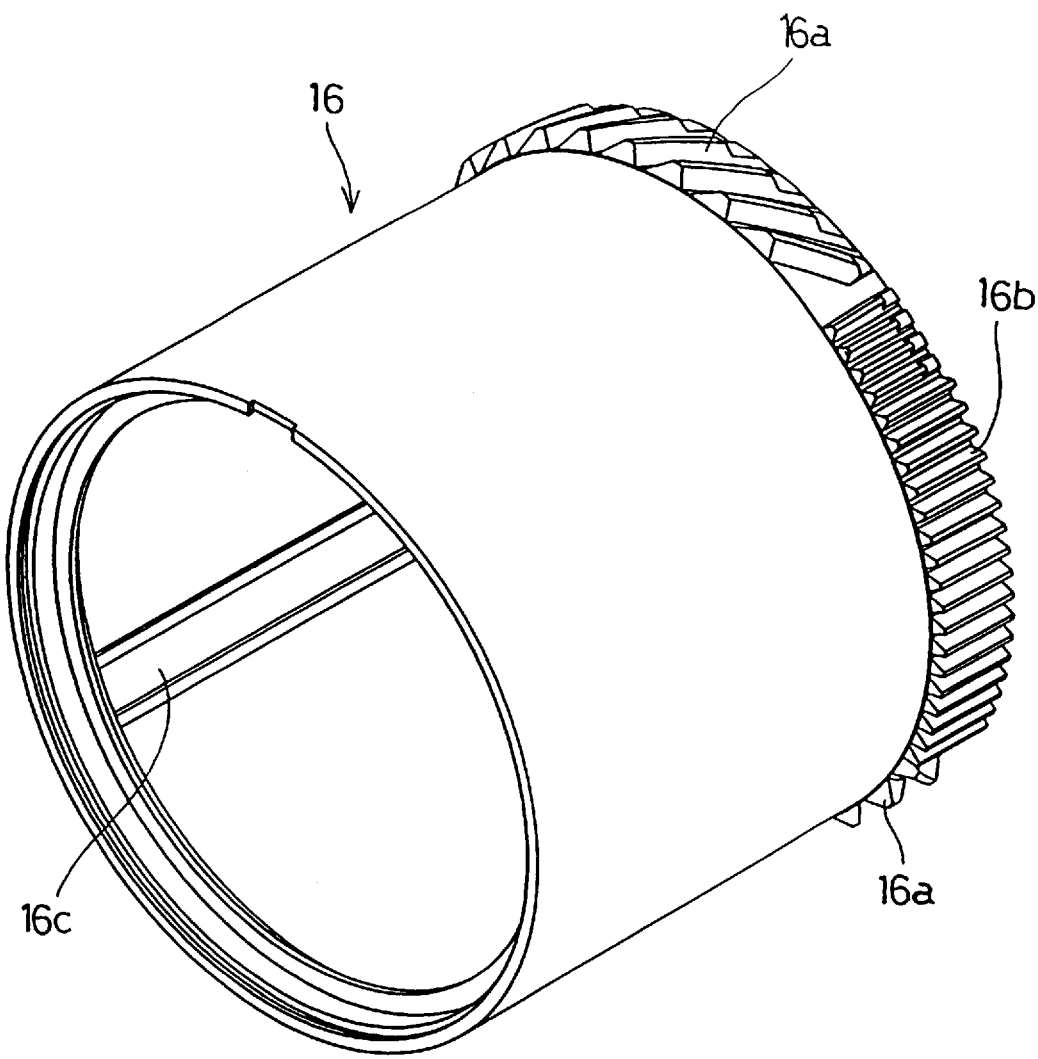
FIG. 6 is an enlarged schematic perspective view of a third moving barrel of the zoom lens barrel.

On an inner periphery of the third moving barrel 16, a plurality of linear guide grooves 16c are formed, each extending parallel to the optical axis O. At an outer periphery of the rear end of the third moving barrel 16, a male helicoid 16a and the aforementioned outer peripheral gear 16b are provided as shown in FIG. 6. The male helicoid 16a engages with the female helicoid 12a of the fixed lens barrel block 12. The outer peripheral gear 16b engages with the driving pinion 15. The driving pinion 15 has an axial length sufficient to be capable of engaging with the outer peripheral gear 16b throughout the entire range of movement of the third moving barrel 16 in the optical axis direction.

Figure 18:
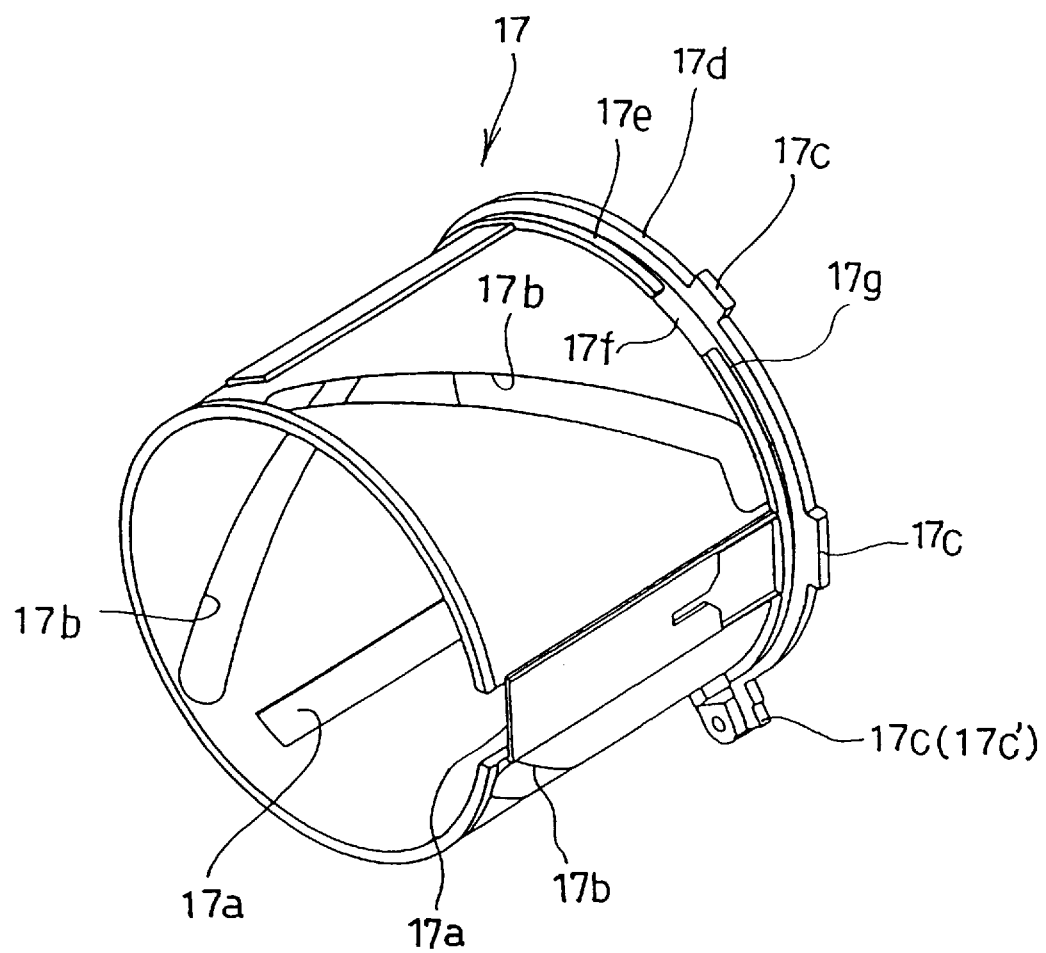
FIG. 18 is an enlarged perspective view of a linear guide barrel shown in FIG. 12.

As shown in FIGS. 12 and 18, the linear guide barrel 17 is provided, on a rear part of an outer periphery thereof, with a rear end flange 17d. The rear end flange 17d has a plurality of engaging projections 17c each projecting away from the optical axis O in a radial direction. The linear guide barrel 17 is further provided with a retaining flange 17e in front of the rear end flange 17d. A circumferential groove 17g is formed between the rear end flange 17d and the retaining flange 17e. The retaining flange 17e has a radius smaller than the rear end flange 17d. The retaining flange 17e is provided with a plurality of cutout portions 17f. Each of the cutout portions 17f allows a corresponding engaging projection 16d to be inserted into the circumferential groove 17g, as shown in FIG. 11.

The third moving barrel 16 is provided, on an inner periphery of the rear end thereof, with a plurality of engaging projections 16d. Each of the engaging projections 16d projects towards the optical axis O in a radial direction. By inserting the engaging projections 16d into the circumferential groove 17g, through the corresponding cutout portions 17f, the engaging projections 16d are positioned in the circumferential groove 17g between the flanges 17d and 17e (see FIG. 11). By rotating the third moving barrel 16 relative to the linear guide barrel 17, the engaging projections 16d are engaged with the linear guide barrel 17.

An aperture plate 23 having a rectangular-shaped aperture 23a approximately the same shape as the aperture 14a is fixed to the read-end of the linear guide barrel 17.

The relative rotation of the linear guide barrel 17, with respect to the fixed lens barrel block 12, is restricted by the slidable engagement of the plurality of engaging projections 17c with the corresponding linear guide grooves 12b, formed parallel to the optical axis O.

A contacting terminal 9 is fixed to one of the engaging projections 17c, namely 17c'. The contacting terminal 9 is in slidable contact with the code plate 13a, fixed to the bottom of the linear guide groove 12b' to generate signals corresponding to focal length information during zooming.

A plurality of linear guide grooves 17a are formed on the inner periphery of the linear guide barrel 17, each extending parallel to the optical axis O. A plurality of lead slots (cam slots) 17b are also formed on the linear guide barrel 17 as shown in FIGS. 12 or 18. The lead slots 17b are each formed oblique (inclined) to the optical axis O.

The second moving barrel 19 engages with the inner periphery of the linear guide barrel 17. On the inner periphery of the second moving barrel 19, a plurality of lead grooves 19c are provided in a direction inclined oppositely to the lead slots 17b. Each lead groove 19c is oblique to both the optical axis direction and a circumferential direction of the linear guide barrel 17 by a predetermined angle, similar to each lead slot 17b. On the outer periphery of the rear end of the second moving barrel 19, a plurality of follower projections 19a are provided. Follower pins 18 are positioned in the follower projections 19a. Each follower pin 18 consists of a ring member 18a, and a center fixing screw 18b which supports the ring member 18a on the corresponding follower projection 19a. The follower projections 19a are in slidable engagement with the lead slots 17b of the linear guide barrel 17, and the follower pins 18 are in slidable engagement with the linear guide grooves 16c of the third moving barrel 16. With such an arrangement, when the third moving barrel 16 rotates, the second moving barrel 19 moves linearly in the optical axis direction, while rotating.

On the inner periphery of the second moving barrel 19, the first moving barrel 20 is engaged. The first moving barrel 20 is provided on an outer periphery of the rear thereof with a plurality of follower pins 24 each engaging with the corresponding inner lead groove 19c. At the same time the first moving barrel 20 is guided linearly by a linear guide member 22. The first moving barrel 20 is provided at the front end thereof with a decorative plate 41.

Figure 1:
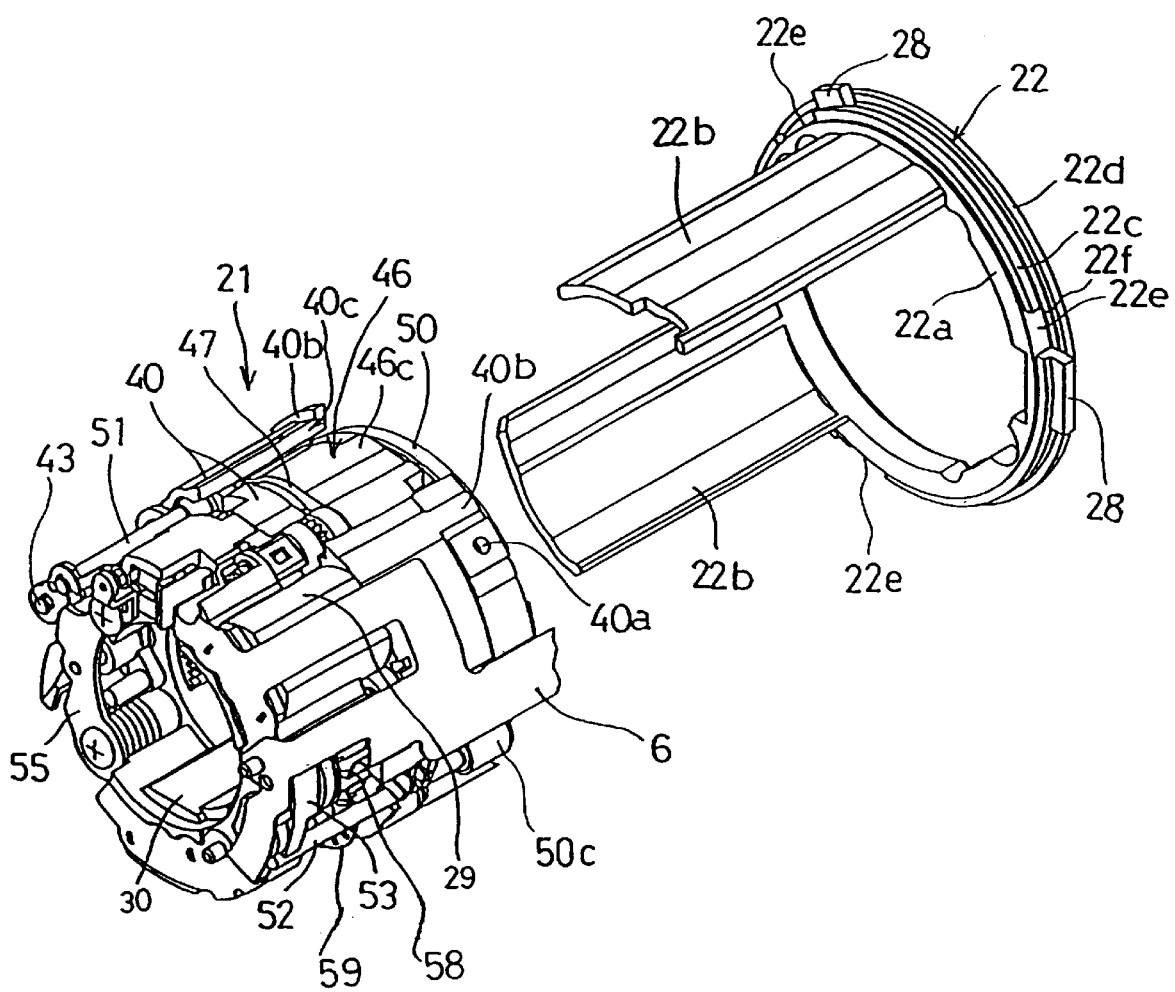
FIG. 1 is an enlarged schematic perspective view showing a part of a zoom lens barrel.
Figure 2:
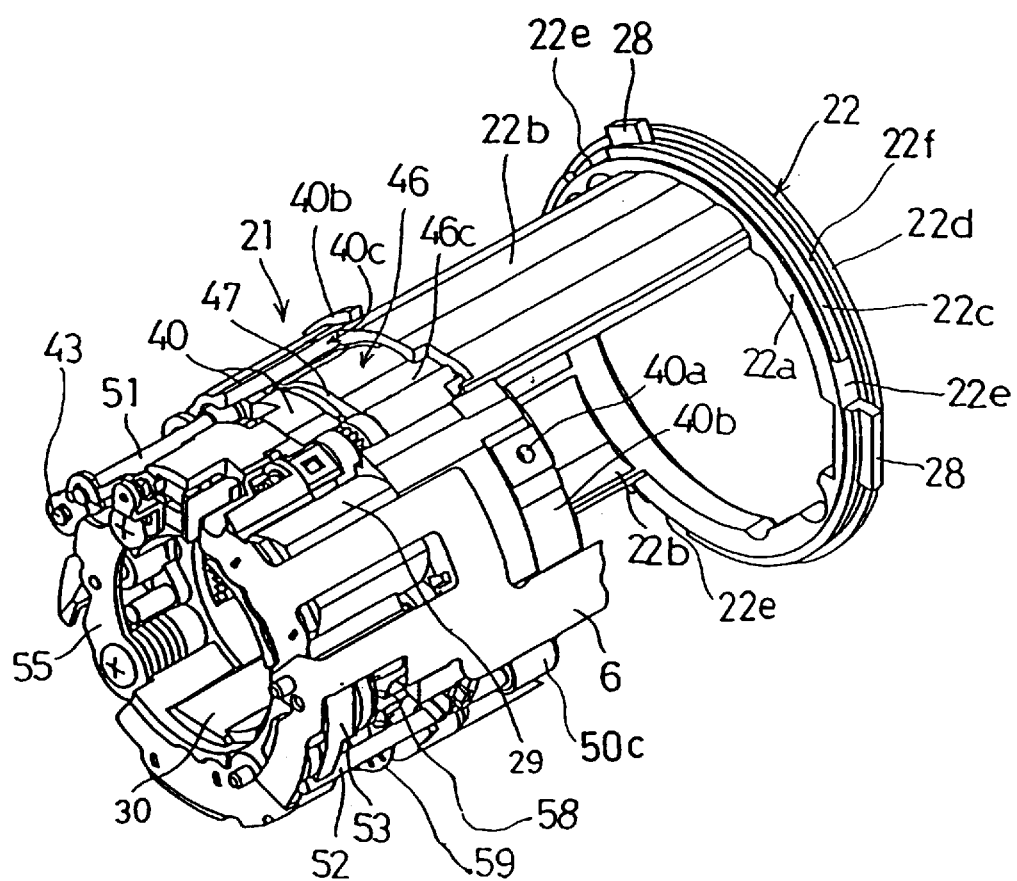
FIG. 2 is a schematic perspective view showing the part of the zoom lens barrel shown in FIG. 1 in an engaged state.
Figure 3:
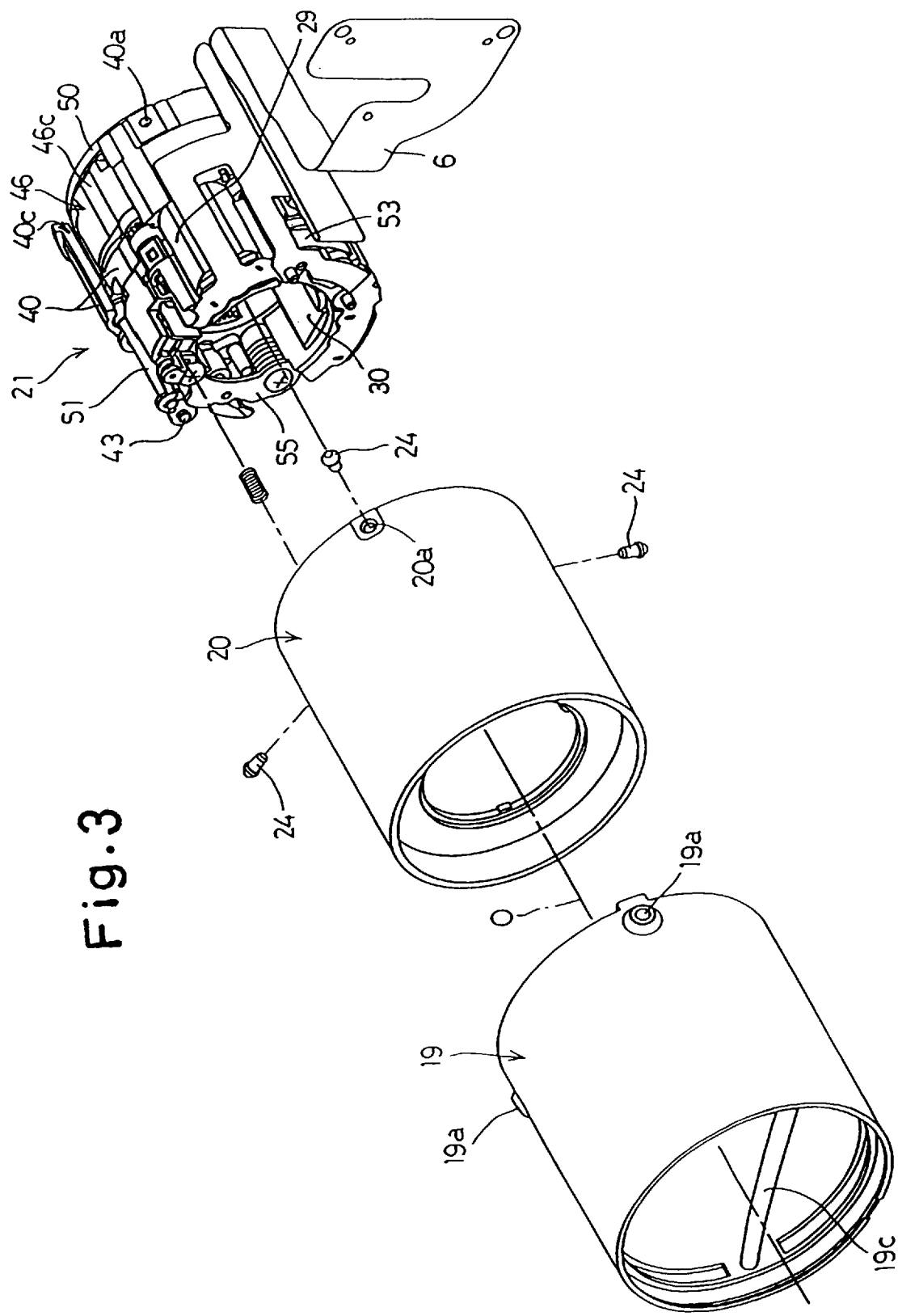
FIG. 3 is an enlarged exploded perspective view of a part of the zoom lens barrel.

As shown in FIGS. 1 and 2, the linear guide member 22 is provided with an annular member 22a, a pair of guide legs 22b and a plurality of engaging projections 28. The pair of guide legs 22b project from the annular member 22a in the optical axis direction. The plurality of engaging projections 28 each project from the annular member 22a away from the optical axis O in a radial direction. The engaging projections 28 slidably engage with the linear guide grooves 17a. The guide legs 22b are respectively inserted into linear guides 40c between the inner peripheral surface of the first moving barrel 20 and the AF/AE shutter unit 21.

Figure 8:
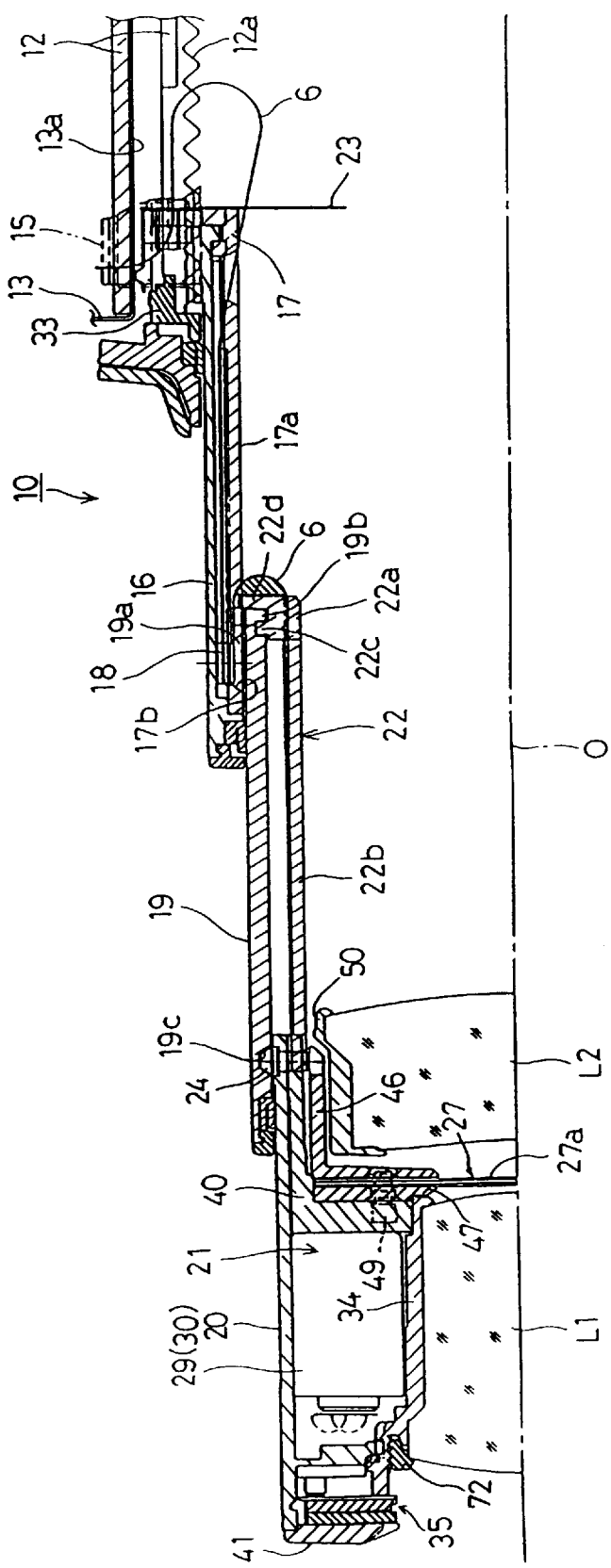
FIG. 8 is a sectional view of an upper part of the zoom lens barrel in a maximum extended state.

The annular member 22a of the linear guide member 22 is connected to the rear of the second moving barrel 19, such that the linear guide member 22 and the second moving barrel 19 are capable of moving along the optical axis O as a whole and relatively rotating around the optical axis O. The linear guide member 22 is further provided on the outer periphery of the rear end thereof with a rear end flange 22d. The linear guide member 22 is further provided in front of the rear end flange 22d with a retaining flange 22c. A circumferential groove 22f is formed between the rear end flange 22d and the retaining flange 22c. The retaining flange 22c has a smaller radius than the rear end flange 22d. The retaining flange 22c is provided with a plurality of cutout portions 22e, as shown in FIGS. 7 or 8, each allowing a corresponding engaging projection 19b to be inserted into the circumferential groove 22f, as shown in FIG. 11.

The second moving barrel 19 is provided on an inner periphery of the rear end thereof with a plurality of engaging projections 19b, each projecting towards the optical axis O in a radial direction. By inserting the engaging projections 19b into the circumferential groove 22f through the corresponding cutout portions 22e, the engaging projections 19b are positioned in the circumferential groove 22f between the flanges 22c and 22d. By rotating the second moving barrel 19 relative to the linear guide member 22, the engaging projections 19b are engaged with the linear guide member 22. With the above structure, when the second moving barrel 19 rotates in the forward or reverse rotational direction, the first moving barrel 20 moves linearly forwardly or rearwardly along the optical axis O, but is restricted from rotating.

Figure 9:
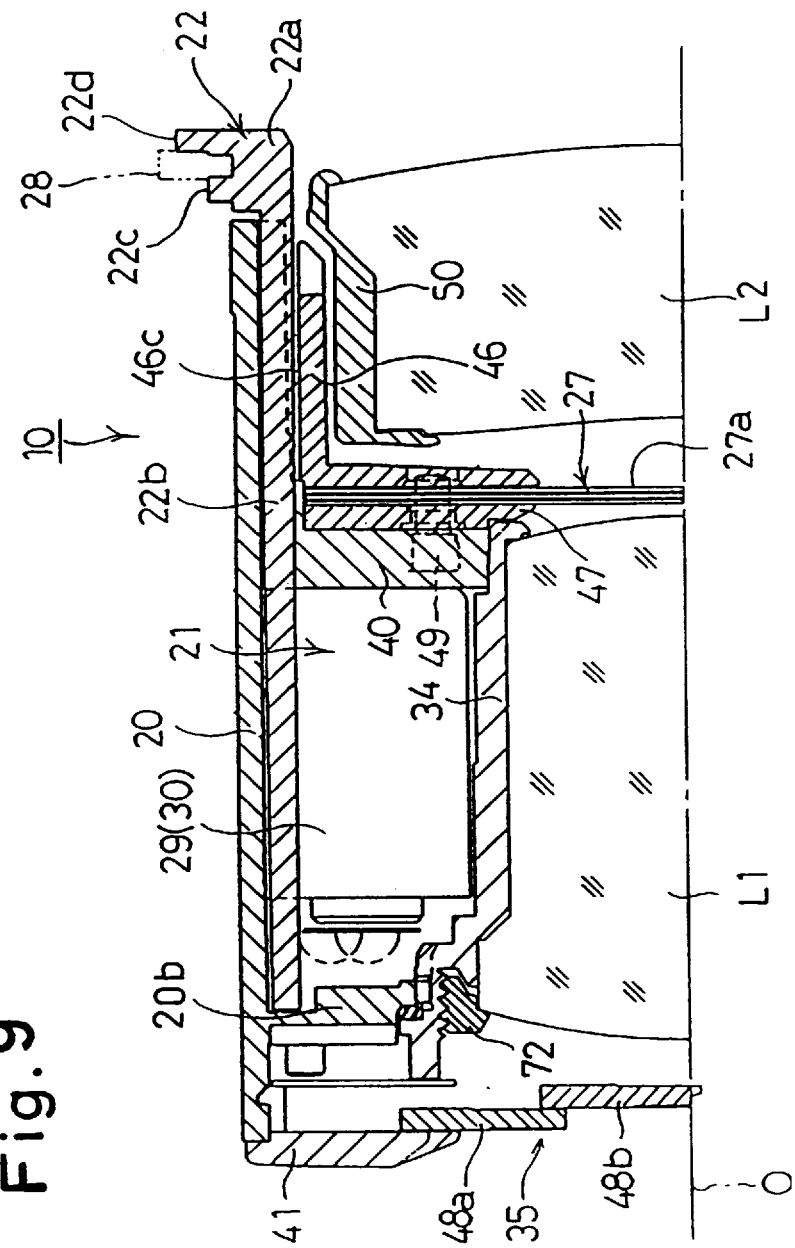
FIG. 9 is a sectional view of an upper part of the zoom lens barrel, illustrating essential elements in a housed state.

At the front of the first moving barrel 20, a barrier apparatus 35 having barrier blades 48a and 48b is mounted. On an inner peripheral face of the first moving barrel 20, the AF/AE shutter unit 21 having the shutter 27, consisting of three shutter blades 27a, is engaged and fixed as shown in FIG. 9. The AF/AE shutter unit 21 is provided with a plurality of fixing holes 40a formed at even angular intervals on the outer periphery of the shutter mounting stage 40. Only one of the fixing holes 40a appears in each of FIGS. 1–5.

Figure 4:
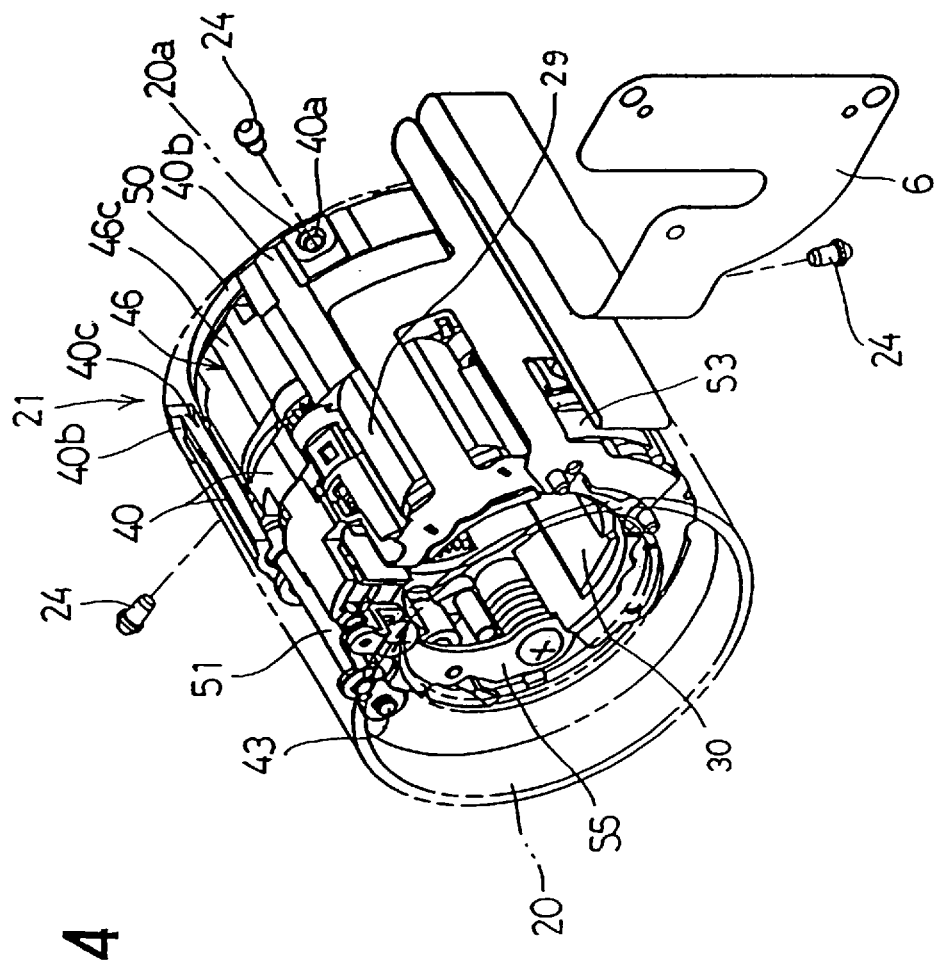
FIG. 4 is a schematic perspective view illustrating a state where an AF/AE shutter unit of the zoom lens barrel is mounted to a first moving barrel.

The aforementioned plurality of follower pins 24, which engage with the inner lead grooves 19c, also serve as a device for fixing the AF/AE shutter unit 21 to the first moving barrel 20. The follower pins 24 are inserted in holes 20a, formed on the first moving barrel 20, and fixed in the fixing holes 40a. With this arrangement the AF/AE shutter unit 21 is secured to the first moving barrel 20 as shown in FIG. 4. In FIG. 4 the first moving barrel 20 is indicated by phantom lines. The follower pins 24 may be fixed by an adhesive, or the pins 24 may be formed as screws to be screwed into the fixing holes 40a.

Figure 5:
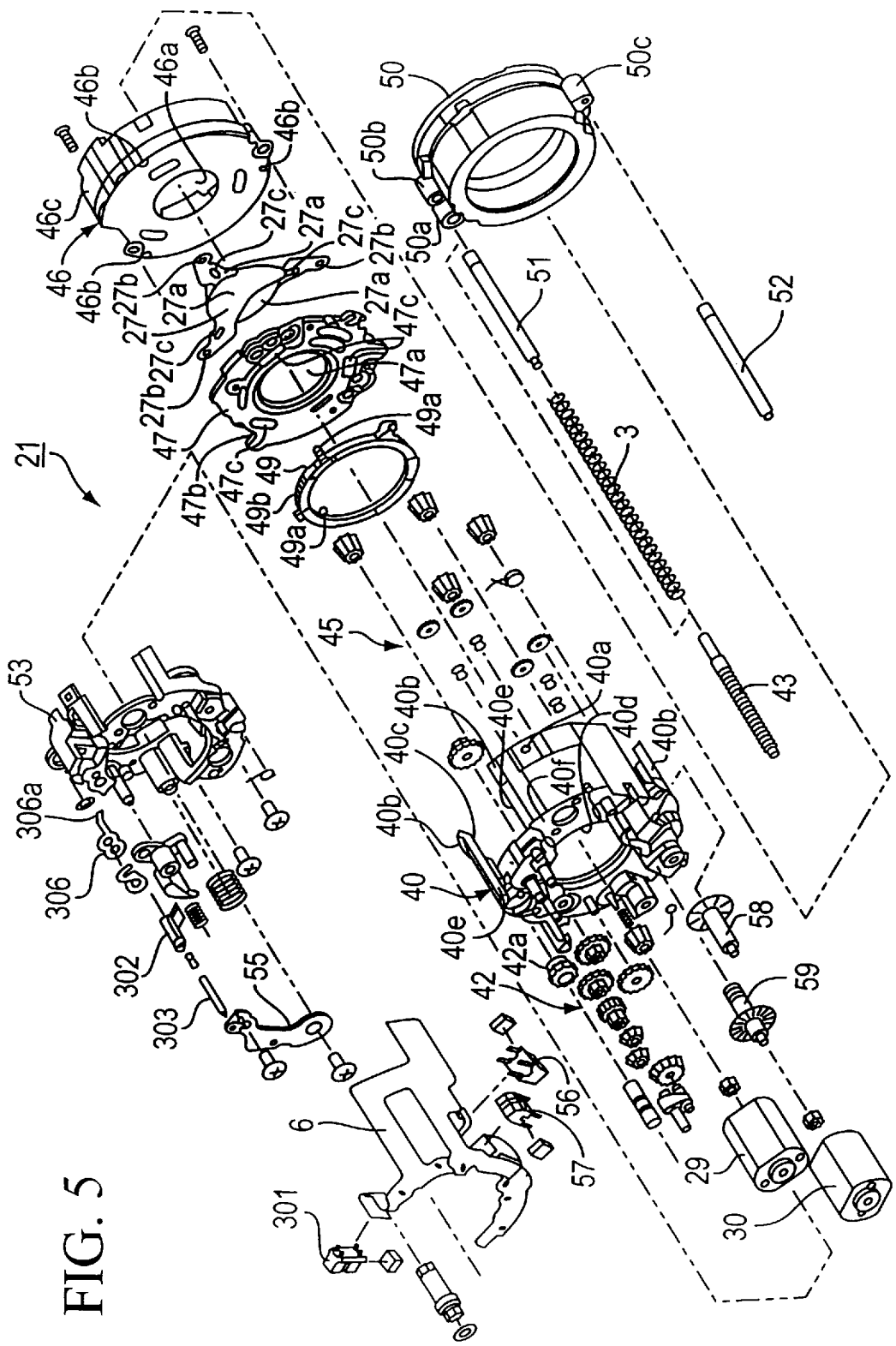
FIG. 5 is an exploded perspective view illustrating main parts of the AF/AE shutter unit of the zoom lens barrel shown in FIGS. 1, 2, 3 or 4.

As illustrated in FIGS. 5 and 12, the AF/AE shutter unit 21 is provided with the shutter mounting state 40, a shutter blade supporting ring 46 fixed on the rear of the shutter mounting stage 40 so as to be located inside the shutter mounting stage 40, and the lens supporting barrel 50 supported in a state of being capable of movement relative to the shutter mounting stage 40. The shutter mounting stage 40 supports the lens supporting barrel 34, the AE motor 29, and the rear lens group driving motor 30. The shutter mounting stage 40 is provided with an annular member 40f having a circular aperture 40d. The shutter mounting stage 40 is also provided with three legs 40b which project rearward from the annular member 40f. Three slits are defined between the three legs 40b. Two of the slits comprise the aforementioned linear guides 40c, which slidably engage with the respective pair of guide legs 22b of the linear guide member 22 so as to guide the movement of the linear guide member 22.

The shutter mounting stage 40 supports an AE gear train 45 which transmits a rotation of the AE motor 29 to the shutter 27, a lens driving gear train 42 which transmits rotation of the rear lens group driving motor 30 to a screw shaft (feed screw shaft) 43, photointerrupters 56 and 57 which are connected to a flexible printed circuit board 6, and rotating disks 58 and 59 which have a plurality of radially formed slits provided in the circumferential direction. An encoder (second encoder) for detecting whether the rear lens group driving motor 30 is rotating and for detecting an amount of rotation of the rear lens group driving motor 30 consists of the photointerrupter 57 and the rotating disk 59. With this encoder, the position of the lens supporting barrel 50 relative to the shutter mounting stage 40 can be detected, i.e., the position of the rear lens group L2 relative to the first lens group L1 in the optical axis O. An AE motor encoder (first encoder) for detecting whether the AE motor 29 is rotating and for detecting an amount of rotation of the AE motor 29 consists of the photointerrupter 56 and the rotating disk 58. With this encoder, the size of a diaphragm formed by the shutter 27 can be detected, and in addition, an opened or closed condition of the shutter 27 can be detected.

The shutter 27, a supporting member 47 which pivotally supports the three shutter blades 27a of the shutter 27, and a circular driving member 49, which gives rotative power to the shutter blades 27a, are positioned between the shutter mounting stage 40 and the shutter blade supporting ring 46, secured to the shutter mounting stage 40. The circular driving member 49 is provided with three operating projections 49a at even angular intervals, which respectively engage with each of the three shutter blades 27a. As shown in FIG. 5, the front end of the shutter blade supporting ring 46 is provided with a circular aperture 46a and with three supporting holes 46b positioned at even angular intervals around the circular aperture 46a. Two deflection restricting surfaces 46c are formed on the outer periphery of the shutter blade supporting ring 46. Each deflection restricting surface 46c is exposed outwardly from the corresponding linear guide 40c and slidably supports the inner peripheral face of the corresponding guide leg 22b.

The supporting member 47, positioned in front of the shutter blade supporting ring 46, is provided with a circular aperture 47a, aligned with the circular aperture 46a of the shutter blade supporting ring 46, and with three pivotal shafts 47b (only one of which is illustrated in FIG. 5) at respective positions opposite the three supporting holes 46b. Each shutter blade 27a is provided at one end thereof with a hole 27b into which the corresponding pivotal shaft 47b is inserted, so that each shutter blade 27a is rotatable about the corresponding pivotal shaft 47b. The major part of each shutter blade 27a that extends normal to the optical axis O from the pivoted end is formed as a light interceptive portion. All three light interceptive portions of the shutter blades 27a together prevent ambient light, which enters from the front lens group L1, from entering the circular apertures 46a and 47a when the shutter blades 27a are closed. Each shutter blade 27a is further provided between the hole 27b and the light interceptive portion with a slot 27c, through which the corresponding operating projection 49a is inserted. The supporting member 47 is fixed to the shutter blade supporting ring 46 in such a manner that each shaft 47b, which supports the corresponding shutter blade 27a, is engaged with the corresponding supporting hole 46b of the shutter blade supporting ring 46.

A gear portion 49b is formed on a part of the outer periphery of the circular driving member 49. The gear portion 49b meshes with one of the plurality of gears in the gear train 45 to receive the rotation from the gear train 45. The supporting member 47 is provided, at respective positions close to the three pivotal shafts 47b, with three arc grooves 47c each arched along a circumferential direction. The three operating projections 49a of the circular driving ring 49 engage with the slots 27c of the respective shutter blades 27a through the respective arc grooves 47c. The shutter blade supporting ring 46 is inserted from the rear of the shutter mounting stage 40 to support the circular driving ring 49, the supporting member 47 and the shutter 27, and is fixed on the shutter mounting stage 40 by set screws 90 respectively inserted through holes 46x provided on the shutter blade supporting ring 46.

Behind the shutter blade supporting ring 46, the lens supporting barrel 50, supported to be able to move relative to the shutter mounting stage 40 via guide shafts 51 and 52, is positioned. The shutter mounting stage 40 and the lens supporting barrel 50 are biased in opposite directions away from each other by a coil spring (biasing compression spring) 3 fitted on the guide shaft 51, and therefore play between the shutter mounting stage 40 and the lens supporting barrel 50 is reduced. In addition, a driving gear 42a, provided as one of the gears in the gear train 42, is provided with a female thread hole (not shown) at the axial center thereof and is restricted to move in the axial direction. The screw shaft 43, one end of which is fixed to the lens supporting barrel 50, engages with the female thread hole. Accordingly, the driving gear 42a and the screw shaft 43 together constitute a feed screw mechanism. In such a manner, when the driving gear 42a rotates forwardly or reversely due to driving by the rear lens group driving motor 30, the screw shaft 43 respectively moves forwardly or rearwardly with respect to the driving gear 42a, and therefore the lens supporting barrel 50, which supports the rear lens group L2, moves relative to the front lens group L1.

A holding member 53 is fixed at the front of the shutter mounting stage 40. The holding member 53 holds the motors 29 and 30 between the holding member 53 and the shutter mounting stage 40. The holding member 53 has a metal holding plate 55 fixed at the front thereof by set screws 99. The motors 29, 30 and the photointerrupters 56, 57 are connected to the flexible printed circuit board 6. One end of the flexible printed circuit board 6 is fixed to the shutter mounting stage 40.

After the first, second and third moving barrels 20, 19 and 16, and the AF/AE shutter unit 21, etc. are assembled, the aperture plate 23 is fixed to the rear of the linear guide barrel 17, and an annular retaining member 33 is fixed at the front of the fixed lens barrel block 12.

In addition to being provided with the above-mentioned drive mechanism for moving the rear lens group L2 with respect to the first lens group L1 along the optical axis O, the AF/AE shutter unit 21 is also provided with a device for detecting whether the rear lens group L2 reaches a predetermined initial position relative to the first lens group L1. In a focusing operation, the rear lens group L2 is firstly driven to move rearwardly from an initial position, away from the first lens group L1 along the optical axis O by a determined amount for focusing. Subsequently, the rear lens group L2 is driven to move back to the initial position after a shutter release operation has been completed. The rear lens group L2 is controlled so as to be locateed at the initial position in each of the following conditions, namely immediately after the main switch of the camera is turned ON, immediately after a shutter release operation has been completed, and when the main switch of the camera is in an OFF state.

The device for detecting whether the rear lens group L2 reaches the initial position thereof will be discussed with reference to FIGS. 14–17.

The lens supporting barrel 50 is guided along the optical axis O through the guide shafts 51, 52. Rear ends of the guide shafts 51, 52 are respectively fixed in bosses 50b, 50c which are integrally formed on the lens supporting barrel 50. The guide shaft 51 is slidably inserted into a bearing 51a fixed on the shutter mounting stage 40, so as to be guided in the optical axis direction. A front end of the guide shaft 52 is free, and the guide shaft 52 slidably fits in a supporting groove 40i (see FIGS. 5, 16 and 17) which is formed on the shutter mounting stage 40 and recessed inwardly in a radial direction of the shutter mounting stage 40.

Due to such a structure in which the guide shaft 52 is positioned in the supporting grove 40i, when the lens supporting barrel 50 moves along the optical axis O with respect to the shutter mounting stage 40, the lens supporting barrel 50 is prevented from rotating about the screw shaft 43 with respect to the shutter mounting stage 40. In other words, but for the guide shaft 52, the lens supporting barrel 50 would rotate about the screw shaft 43 with respect to the shutter mounting stage 40 when the screw shaft 43 is driven to move in the optical axis direction by rotation of the driving gear 42a, even though the guide shaft 51 isa provided parallel to the screw shaft 43. This is because the screw shaft 43 and the guide shaft 51 are closely arranged in parallel to each other.

The guide shafts 51, 52, the screw shaft 43, the driving gear 42a, etc. constitute a lens guide mechanism for guiding the lens supporting barrel 50 along the optical axis O relative to the shutter mounting stage 40, that is, relative to the first lens group L1. The lens guide mechanism also supports the rear lens group L2.

Figure 14:
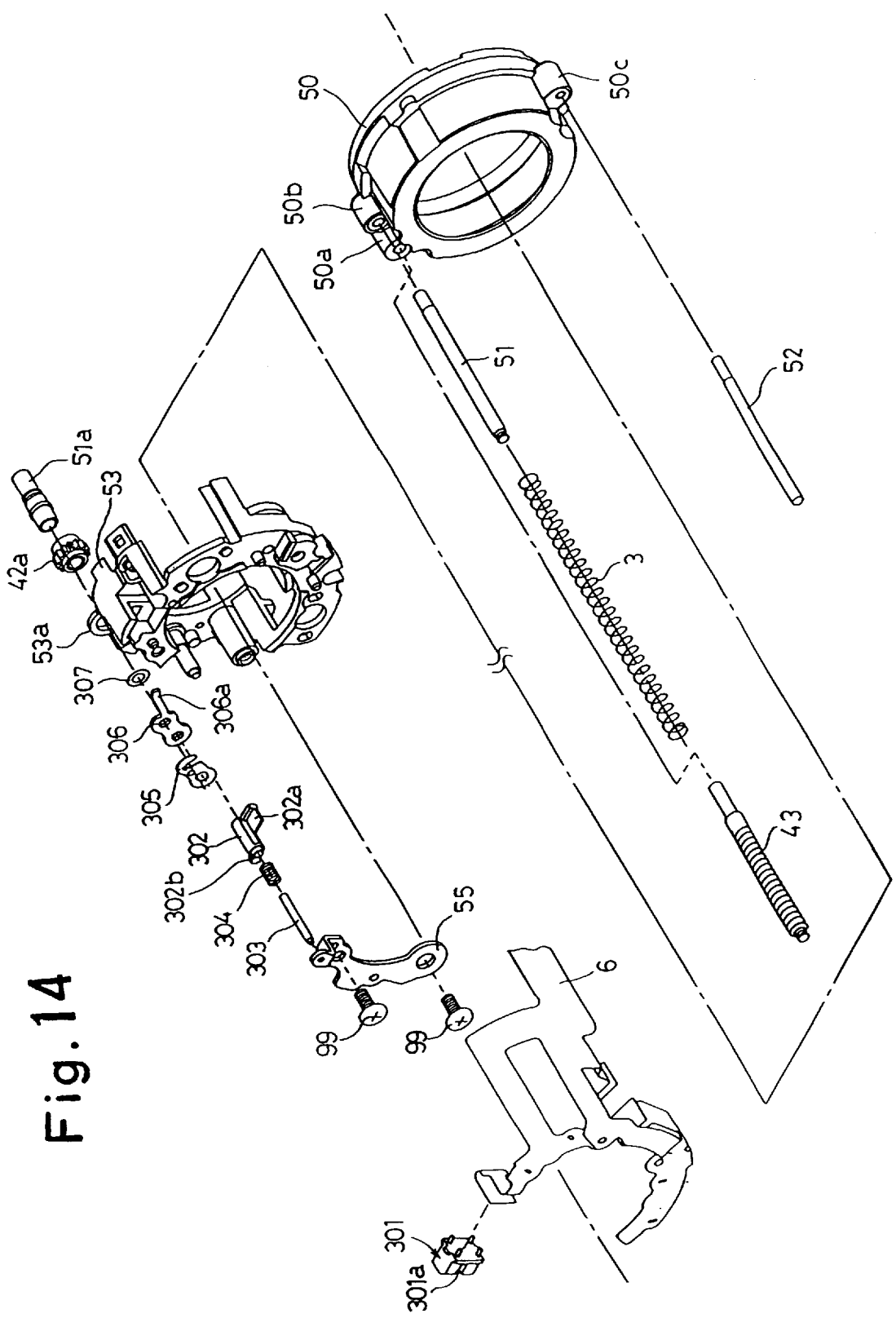
FIG. 14 is an exploded perspective view of a lens drive mechanism of the zoom lens barrel.

The rear end of the screw shaft 43 is secured to a boss 50a formed on the shutter mounting stage 40 in the vicinity of the boss 50b. The driving gear 42a, having the female screw hole (not shown) at the axial center thereof as noted above, is rotatably fitted on the screw shaft 43, with the female screw hole engaging with a male screw formed on the screw shaft 43. The rearward movement of the driving gear 42a along the screw shaft 43 is restricted by the shutter mounting stage 40. In addition, the forward movement of the driving gear 42a along the screw shaft 43 is restricted by a supporting ring 53a integrally formed on the holding member 53, as can be seen in FIG. 14. Due to this structure, the driving gear 42a is prevented from moving along the screw shaft 43 relative to the shutter mounting stage 40. In other words, the distance between the driving gear 42a and the shutter mounting stage 40 remains constant.

Figure 15:
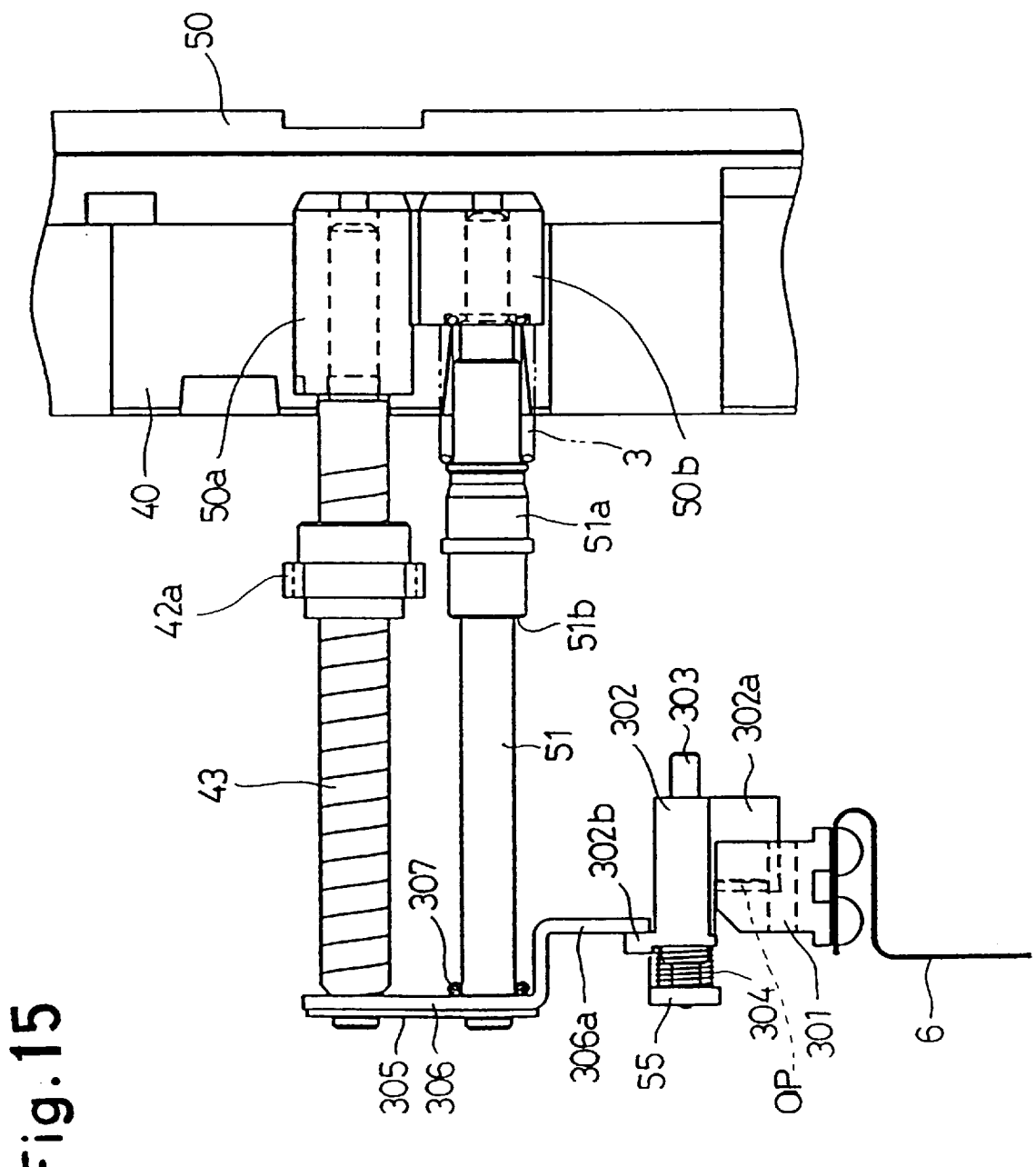
FIG. 15 is a schematic plan view of a part of the lens drive mechanism shown in FIG. 14.

When the driving gear 42a is driven to rotate by the rear lens group driving motor 30, the screw shaft 43 moves along the axis thereof, i.e., along the optical axis direction, relative to the driving gear 42a, which causes the rear lens group L2, supported by the lens supporting barrel 50, to move forwardly or rearwardly along the optical axis O relative to the first lens group L1. In order to prevent the occurrence of blacklash between the screw shaft 43 and the driving gear 42a, the coil spring 3 is fitted on the guide shaft 51 between the bearing 51a and the boss 50b, as shown in FIG. 15. Due to force exerted by the coil spring 3, the lens supporting barrel 50 is always biased rearwardly away from the shutter mounting stage 40 along the optical axis O. This prevents backlash from occurring between the screw shaft 43 and the driving gear 42a.

A photointerrupter 301 and a light-interrupting member 302 are provided adjacent to each other at a front end of the shutter mounting stage 40 in the vicinity of the metal holding pate 55. The photointerrupter 301 and the light-interrupting member 302 together constitute a detector for detecting whether the rear lens group L2 reaches the aforementioned initial position relative to the front lens group L1. The photointerrupter 301 is mounted on a part of the flexible circuit board 6 which is fixed on the shutter mounting stage 40. The light-interrupting member 302 has a cylindrical body at rear and front ends of which a light-intercepting plate 302a, and an engaging projection 302b are integrally formed, respectively.

Figure 16:
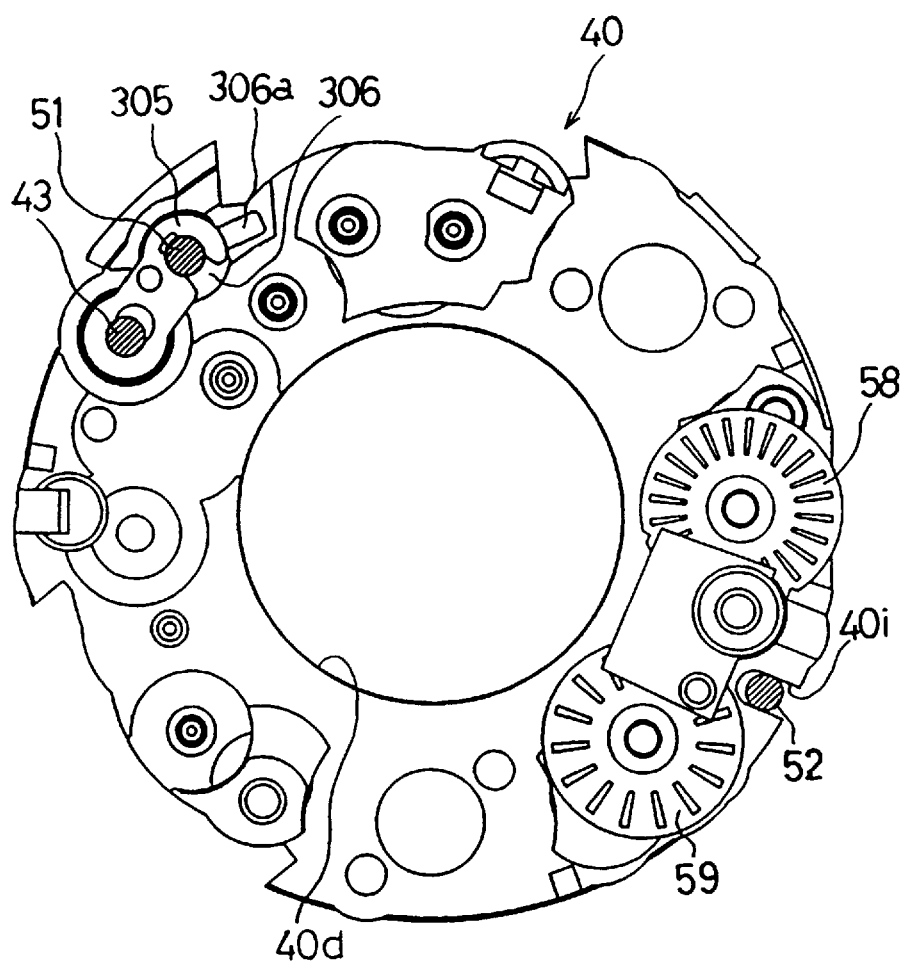
FIG. 16 is a schematic front view of a part of the AF/AE shutter unit.
Figure 17:
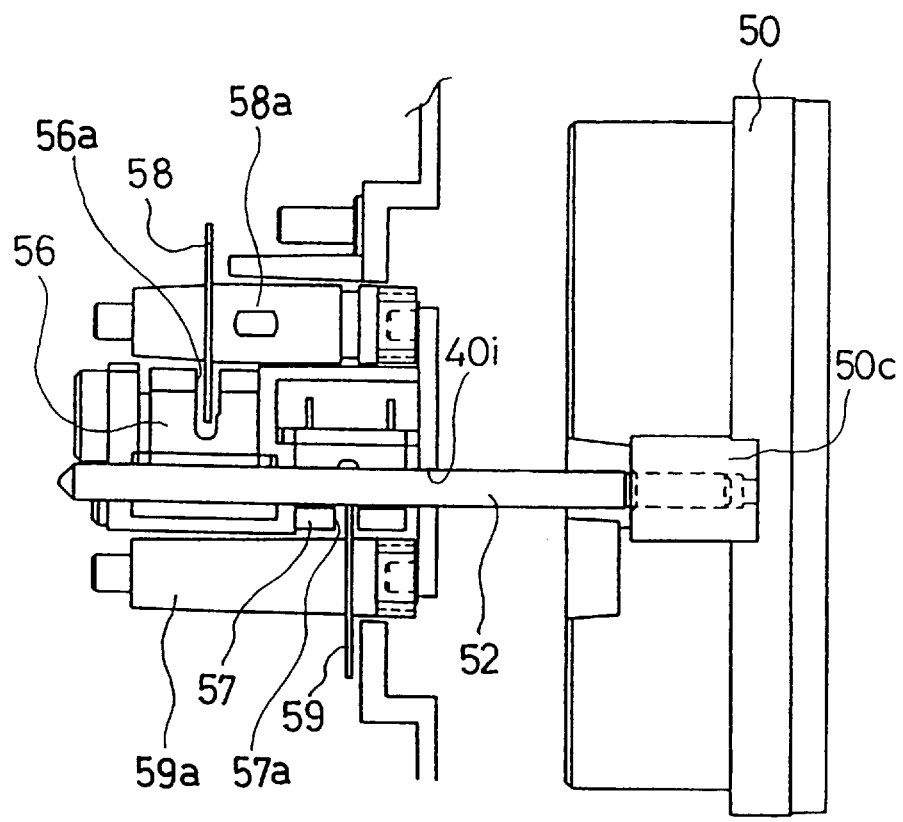
FIG. 17 is a schematic plan view of a part of the AF/AE shutter unit.

The light-interrupting member 302 is slidably fitted on a shaft 303. The front and rear ends of the shaft 303 are supported by the metal holding plate 55 and the holding member 53, respectively, as shown in FIGS. 16 or 17. A coil spring (biasing compression spring) 304 is disposed on the shaft 303, and is held between the metal holding plate 55 and the front end of the light-interrupring member 302, so that the light-interrupting member 302 is always biased rearwardly toward the shutter mounting stage 40 in the optical axis direciton.

A slit 301a extending in the optical axis direction is formed on the photointerrupter 301 as shown in FIG. 14. The light-intercepting plate 302a is capable of moving in the slit 301a to interrupt a light path OP formed approximately in the middle of the slit 301a. Namely, a front part of the light-intercepting plate 302a is positioned inside the slit 301a, but outside the light path OP when the light-interrupting member 302 is located at a retracted position thereof (the position shown in FIG. 17) due to the biasing force of the coil spinrg 304. The front part of the light-intercepting plate 302a is positioned inside the slit 301a to interrupt the light path OP when the light-interrupting member 302 moves forwardly to a predetermined position, against the biasing force of the coil spring 304, as shown in FIGS. 15 or 16.

A stopper plate 306 is secured to the front end of each of the screw shaft 43 and the guide shaft 51 through a washer 305. An engaging pin 306a is integrally formed on the stopper plate 306. The engaging pin 306a is capable of engaging with the engaging projection 302b of the light-interrupting member 302. Namely, when the lens supporting barrel 50, which supports the rear lens group L2, moves forwardly to a predetermined position close to a front extremity of the movable range of the lens supporting barrel 50 relative to the shutter mounting stage 40, the engaging pin 306a engages with the engaging projection 302b. Thereafter, when the lens supporting barrel 50 moves further forward, the engaging pin 306a further advances to move the engaging projection 302b forwardly against the biasing force of the coil spring 304. Thereafter, when the rear lens group L2 reaches the initial position thereof relative to the front lens group L1, that is, when the lens supporting barrel 50 reaches an initial position thereof relative to the shutter mounting stage 40, the light-intercepting plate 302a intercepts the light path OP.

Whether the rear lens group L2 reaches the initial position, that is, whether the lens supporting barrel 50 reaches the initial position, is detected by a CPU (not shown) which monitors the output of the photointerrupter 301. The CPU is provided in the camera for controlling various operations (e.g., focusing operations, photometering operations, etc.). When the CPU detects that the rear lens group L2 reaches the initial position, the CPU controls the rear lens group driving motor 30 so stop such that the rear lens group L2 is not moved forwardly relative to the first lens group L1.

An O-ring (impact absorbing member) 307, made of an elastic member such as rubber, is fitted on the guide shaft 51 between the stopper plate 306 and the bearing 51a. Additionally, the O-ring 307 may be formed from other types of elastic materials.

The details of the aforementioned lens guide mechanism for guiding the lens supporting barrel 50 along the optical axis O relative to the shutter mount stage 40, will be hereinafter discussed with reference to mainly FIGS. 16 and 17.

The shutter mounting stage 40, which has the photographing aperture at the center thereof, is formed substantially ring shaped, as can be seen in FIG. 16. The photointerrupters 56, 57 are disposed adjacent to each other, substantially along a direction parallel to the optical axis O, with a slit 56a of the photointerrupter 56 and a slit 57a of the photointerrupter 57 facing in opposite directions, as shown in FIG. 17. The rotating disk 58 is provided with an integrally formed rotating shaft 58a. The rotating shaft 58a is positioned adjacent to the photointerrupter 56 and extends parallel to the optical axis O, and the rotating disk 58 is located within the slit 56a. The rotating disk 59 is also provided with an integrally formed rotating shaft 59a. The rotating shaft 59a is positioned adjacent to the photointerrupter 57 and extends parallel to the optical axis O, and the rotating disk 59 is located within the slit 57a. Due to this arrangement, the photointerrupters 56, 57 and the rotating disks 58, 59 are space-efficiently disposed on the AF/AE shutter unit 21. The screw shaft 43 and the guide shaft 51, which are closely arranged in parallel to each other, are disposed substantially opposite to the photointerrupters 56, 57 relative to the circular aperture 40d, as shown in FIG. 16. Since the guide shaft 51 is disposed close to the screw shaft 43, which is driven to move in an axial direction by a rotation of the driving pinion 42a relative to the shutter mounting stage 40, the lens supporting barrel 50 is stably driven to move linearly along the optical axis O relative to the shutter mounting stage 40.

The guide shaft 52 slidably fits in the supporting groove 40i, as noted above. The width of the supporting groove 40i is substantially equal to (or slightly larger than) the diameter of the guide shaft 52, and the depth of the supporting groove 40i is longer than the diameter of the guide shaft 52, as shown in FIG. 16. Due to the supporting groove 40i having this structure, the guide shaft 52 is restricted from moving in a circumferential direction of the shutter mounting stage 40, but is allowed to move substantially in a radial direction of the shutter mounting stage 40 along the supporting groove 40i, as can be understood from FIG. 16. With this structure, when the lens supporting barrel 50 moves along the optical axis O with respect to the shutter mounting stage 40, the lens supporting barrel 50 can move smoothly, even if a size of a component or components of the AF/AE shutter unit 21, e.g., the shutter mounting stage 40, the lens supporting barrel 50, the holding member 53, etc., is not precisely formed (molded) and/or even if the guide shafts 51, 52 do not precisely extend parallel to each other.

In addition, due to such a structure in which the guide shaft 52 is positioned in the supporting groove 40i, when the lens supporting barrel 50 moves along the optical axis O with respect to the shutter mounting stage 40, the lens supporting barrel 50 is prevented from rotating about the screw shaft 43 with respect to the shutter mounting stage 40. In other words, but for the guide shaft 52, the lens supporting barrel 50 would rotate about the screw shaft 43 with respect to the shutter mounting stage 40 when the screw shaft 43 is driven to move in the optical axis direction by rotation of the driving gear 42a, even though the guide shaft 51 is provided parallel to the screw shaft 43. This is because the screw shaft 43 and the guide shaft 51 are closely arranged in parallel to each other, as mentioned above.

As shown in FIG. 17, the supporting groove 40i is formed on the shutter mounting stage 40 at a position between the rotating disks 58, 59 in a direction parallel to the optical axis O so as to allow the guide shaft 52 to extend between the rotating disks 58, 59. This arrangement is space-efficient and contributes to the realization of a small-sized AF/AE shutter unit 21, since the guide shaft 52 is disposed in a narrow space between the rotating disks 58, 59.

In the above-described embodiment of the zoom lens barrel 10, although the zoom lens optical system consists of two movable lens groups, namely the front lens group L1 and the rear lens group L2, it should be understood that the present invention is not limited to the present embodiment disclosed above, but the present invention may also be applied to another type of zoom lens optical system including one or more fixed lens groups.

In addition, in the above embodiment, the rear lens group L1 is provided as a component of the AF/AE shutter unit 21, and the AE motor 29 and the rear lens group driving motor 30 are mounted to the AF/AE shutter unit 21. With such a structure, the structure for supporting the front and rear lens groups L1 and L2 and the structure for driving the rear lens group L2 are both simplified. Alternatively, the zoom lens barrel 10 may be realized in such a manner by making the rear lens group L2 a member separate from the AF/AE shutter unit 21. The AF/AE shutter unit 21 may be provided with the shutter mounting stage 40, the circular driving member 49, the supporting member 47, the shutter blades 27, the shutter blade supporting ring 46 and the like, and that the rear lens group L2 may be supported by a supporting member other than the AF/AE shutter unit 21.

In the zoom lens camera of the present embodiment, the operation by rotation of the whole optical unit driving motor 25 and the rear lens group driving motor 30 will now be described with reference to FIGS. 8–11.

As shown in FIGS. 9 or 11, when the zoom lens barrel 10 is at the most retracted (withdrawn) position, i.e., the lens-housed condition, when the power switch is turned ON, the whole optical unit driving motor 25 is driven to rotate its drive shaft in the forward rotational direction by a small amount. This rotation of the motor 25 is transmitted to the driving pinion 15 through a gear train 26, which is supported by a supporting member 32 formed integral with the fixed lens barrel block 12, to rotate the third moving barrel 16 in one predetermined rotational direction to advance forwardly along the optical axis O. Therefore, the second moving barrel 19 and the first moving barrel 20 are each advanced by a small amount in the third optical axis direction, along with the third moving barrel 16. Consequently, the camera is in a state capable of photographing, with the zoom lens positioned at the widest position, i.e., the wide end. At this stage, due to the fact that the amount of movement of the linear guide barrel 17, with respect to the fixed lens barrel block 12 is detected through the relative sliding motion between the code plate 13a and the contacting terminal 9, the focal length of the zoom lens barrel 10, i.e., the front and rear lens groups L1 and L2, is detected.

In the photographable state as above described, when the aforementioned zoom operating lever is manually moved towards a "tele" side, or the "tele" zoom button is manually depressed to be turned ON, the whole optical unit driving motor 25 is driven to rotate its drive shaft in the forward rotational direction through the whole optical unit driving motor controller 60 so that the third moving barrel 16 rotates in the rotational direction to advance along the optical axis O via the driving pinion 15 and the outer peripheral gear 16b. Therefore, the third moving barrel 16 is advanced from the fixed lens barrel block 12 according to the relationship between the female helicoid 12a and the male helicoid 16a. At the same time, the linear guide barrel 17 moves forwardly in the optical axis direction together with the third moving barrel 16, without relative rotation to the fixed lens barrel block 12, according to the relationship between the engaging projections 17c and the linear guide grooves 12b. At this time, the simultaneous engagement of the follower pins 18 with the respective lead slots 17b and linear guide grooves 16c causes the second moving barrel 19 to move forwardly relative to the third moving barrel 16 in the optical axis direction, while rotating together with the third moving barrel 16 in the same rotational direction relative to the fixed lens barrel block 12. The first moving barrel 20 moves forwardly from the second moving barrel 19 in the optical axis direction, together with the AF/AE shutter unit 21, without relative rotation to the fixed lens barrel block 12, because of the above-noted structures in which the first moving barrel 20 is guided linearly by the linear guide member 22 and in which the follower pins 24 are guided by the lead grooves 19c. During such movements, because the moving position of the linear guide barrel 17 with respect to the fixed lens barrel block 12 is detected by the relative sliding motion between the code plate 13a and the contacting terminal 9, the focal length set by the zoom operation device 62 is detected.

Conversely, when the zoom operating lever is manually moved towards a "wide" side, or the "wide" zoom button is manually depressed to be turned ON, the whole optical unit driving motor 25 is driven to rotate its drive shaft in the reverse rotational direction through the whole optical unit driving motor controller 60 so that the third moving barrel 16 rotates in the rotational direction to retract into the fixed lens barrel block 12 together with the linear guide barrel 17. At the same time, the second moving barrel 19 is retracted into the third moving barrel 16, while rotating in the same direction as that of the third moving barrel 16, and the first moving barrel 20 is retracted into the rotating second moving barrel 19 together with the AF/AE shutter unit 21. During the above retraction driving, like the case of advancing driving as above described, the rear lens group driving motor 30 is not driven.

Figure 10:
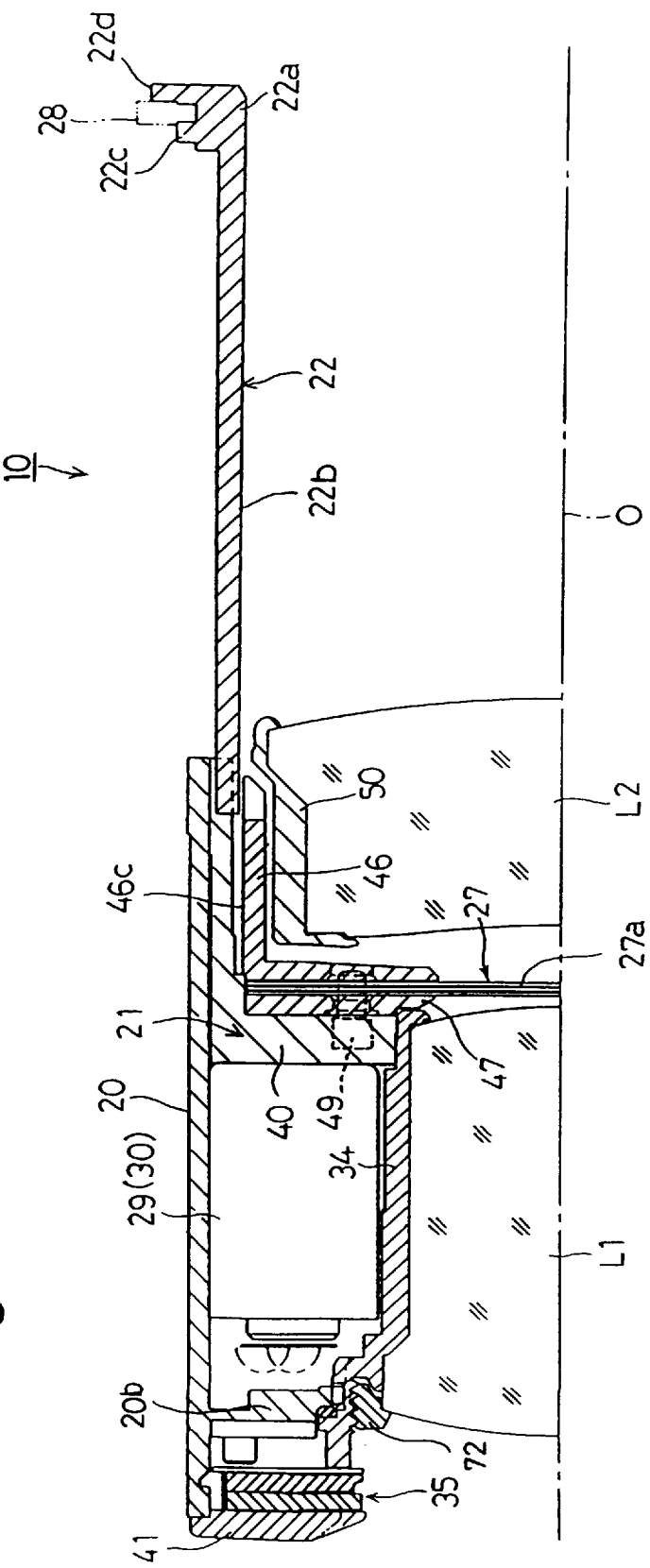
FIG. 10 is a sectional view of the upper part of the zoom lens barrel shown in FIG. 9 in the maximum extended state.

While the zoom lens barrel 10 is driven during the zooming operation, since the rear lens group driving motor 30 is not driven, the front lens group L1 and the rear lens group L2 move as a whole, maintaining a constant distance between each other, as shown in FIGS. 8 or 10. The focal length input via the zoom code plate 13a and the contacting terminal 9 may be indicated on an LCD panel (not shown) provided on the camera body.

At any focal length set by the zoom operating device 62, when the release button is depressed by a half-step, the object distance measuring apparatus 64 is actuated to measure a current subject distance. At the same time the photometering apparatus 65 is actuated to measure a current subject brightness. Thereafter, when the release button is fully depressed, the whole optical unit driving motor 25 and the rear lens group driving motor 30 are each driven by respective amounts determined in accordance with the focal length information set in advance and the subject distance information obtained from the object distance measuring apparatus 64. This operation moves the front and rear lens groups L1 and L2 to respective specified positions to obtain a specified focal length to bring the subject into focus. Immediately after the subject is brought into focus, the AE motor 29 is driven via the AE motor controller 66 to rotate the circular driving member 49 by an amount corresponding to the subject brightness information obtained from the photometering apparatus 65 so that the shutter 27 is driven to open the shutter blades 27a by a specified amount which satisfies the required exposure. Immediately after such a shutter release operation, in which the three shutter blades 27a are opened and subsequently closed, is completed, the whole optical unit driving motor 25 and the rear lens group driving motor 30 are both driven to move the front lens group L1 and the rear lens group L2 to the respective initial positions which they were at prior to a shutter release.

In the present embodiment of the zoom lens barrel 10, "Fantas Coat SF-6" is used as the coating 72*e*. However, another coating may be used as the coating 72*e* which has waterproof properties and makes the circular abutting surface 72*b* a smooth surface such that substantially no gap is formed between the circular abutting surface 72*b* and the circumferential portion fp.

Obvious changes may be made in the specific embodiments of the present invention described herein, such modifications being within the spirit and scope of the invention claimed. It is indicated that all matter contained herein is illustrative and is not intended to limit the scope of the present invention to such illustrative embodiments.

What is claimed is:

1. A lens guide mechanism comprising:
    a first member and a second member positioned adjacent to each other, said second member supporting a lens group, said second member being movable relative to said first member along an optical axis of said lens group;
    a first guide shaft extending from said first member to said second member in a direction of said optical axis, one end of said first guide shaft being secured to said second member;
    a lens shutter provided on said first member;
    a first encoder provided on said first member for detecting a size of a diaphragm formed by said lens shutter, said first encoder comprising a first photosensor and a first rotating disk associated with said first photosensor; and
    a second encoder provided on said first member for detecting an axial position of said lens group, said second encoder comprising a second photosensor and a second rotating disk associated with said second photosensor,
    wherein said first and second rotating disks are positioned adjacent to said first guide shaft, said first guide shaft being positioned between said first and second rotating disks.

2. The lens guide mechanism according to claim 1, wherein each of said first and second photosensors is a photointerrupter.

3. The lens guide mechanism according to claim 1, wherein each of said first and second rotating disks is provided with a plurality of slits.

4. The lens guide mechanism according to claim 1, further comprising a screw shaft on which a first thread is formed, said screw shaft extending in said direction of said optical axis, one end of said screw shaft being secured to said second member.

5. The lens guide mechanism according to claim 4, wherein said first guide shaft is supported on said first member to slide in said direction of said optical axis and to prevent said second member from rotating about said screw shaft with respect to said first member.

6. The lens guide mechanism according to claim 4, further comprising:
    a gear rotatably supported on said first member, said gear being immovable in said direction of said optical axis relative to said first member, said gear having a hole formed at an axial center, and a second thread formed on an inner periphery of said hole, said gear being rotatably fitted on said screw shaft with said second thread meshing with said first thread.

7. The lens guide mechanism according to claim 6, wherein said first member supports a motor for driving said gear to rotate about said screw shaft.

8. The lens guide mechanism according to claim 1, further comprising a second guide shaft which extends in said direction of said optical axis, said second guide shaft being supported by said first member to be guided in said direction of said optical axis, one end of said second guide shaft being secured to said second member, wherein said first and second guide shafts are positioned substantially opposite to each other with respect to said optical axis.

9. The lens guide mechanism according to claim 8, further comprising a screw shaft on which a first thread is formed, said screw shaft extending in said direction of said optical axis, one end of said screw shaft being secured to said second member, said screw shaft being positioned adjacent to said second guide shaft.

10. The lens guide mechanism according to claim 9, wherein the other end of said screw shaft and said second guide shaft are supported by a common supporting plate.

11. The lens guide mechanism according to claim 8, further comprising a bearing fixed on said first member, said bearing supporting and guiding said second guide shaft in said direction of said optical axis.

12. The lens guide mechanism according to claim 11, further comprising a coil spring fitted on said second guide shaft between said bearing and said second member to bias said second member in a direction away from said first member along said optical axis.

13. The lens guide mechanism according to claim 1, wherein said first member comprises a supporting groove formed on said first member which is recessed inwardly in a radial direction of said first member, wherein said first guide shaft is fitted in said supporting groove to be slidable in said direction of said optical axis.

14. The lens guide mechanism according to claim 1, wherein said first member supports a lens supporting barrel which supports another lens group.

15. The lens guide mechanism according to claim 1, wherein said first member supports a motor for driving said lens shutter.

16. The lens guide mechanism according to claim 1, further comprising a zoom lens, said zoom lens including a front lens group and a rear lens group, wherein said rear lens group is said lens group supported by said second member.

17. A zoom lens which includes front and rear lens groups, said zoom lens being provided with a rear lens group drive mechanism for driving said rear lens group to move along an optical axis relative to said front lens group, said zoom lens comprising:
    a shutter mounting stage which supports a lens shutter consisting of a plurality of shutter blades;
    a lens supporting member which supports said rear lens group, said lens supporting member being movable along said optical axis relative to said shutter mounting stage without rotating about said optical axis;
    a first guide shaft extending from a first member to a second member in a direction of said optical axis, a rear end of said first guide shaft being secured to said second member, wherein said first guide shaft is supported on said first member such that said first guide shaft is movable in said direction of said optical axis relative to said first member and immovable in a circumferential direction of said first member;
    a second guide shaft extending in said direction of said optical axis, said second guide shaft being supported on said shutter mounting stage to be guided in said direction of said optical axis, a rear end of said second guide shaft being secured to said lens supporting member;
    a gear rotatably supported on said shutter mounting stage, said gear being immovable in said direction of said optical axis relative to said shutter mounting stage, said gear having a hole formed at an axial center, and a female thread being formed on an inner periphery of said hole;

a screw shaft on which a male thread is formed, said screw shaft extending in said direction of said optical axis, a rear end of said screw shaft being secured to said lens supporting member, said gear being rotatable fitted on said screw shaft and said female thread meshing with said male thread;

a first encoder provided on said shutter mounting stage for detecting a size of a diaphragm formed by said lens shutter, said first encoder comprising a first photosensor and a first rotating disk associated with said first photosensor; and a second encoder provided on said shutter mounting stage for detecting an axial position of said rear lens group, said second encoder comprising a second photosensor and a second rotating disk associated with said second photosensor, wherein said first and second guide shafts are positioned substantially opposite to each other with respect to said optical axis, and wherein said first and second rotating disks are positioned adjacent to said first guide shaft, and said first guide shaft being positioned between said first and second rotating disks.

18. The zoom lens according to claim 17, further comprising a first moving barrel, a second moving barrel and a third moving barrel concentrically arranged in this order from said optical axis, wherein said first moving barrel supports said shutter mounting stage.

* * * * *